(12) United States Patent
Ishii et al.

(10) Patent No.: US 7,243,610 B2
(45) Date of Patent: Jul. 17, 2007

(54) PLASMA DEVICE AND PLASMA GENERATING METHOD

(75) Inventors: Nobuo Ishii, Hyogo (JP); Makoto Ando, 1-1-I-312, Oqura, Saiwai-ku, Kawasaki-shi, Kanagawa 211-0954 (JP); Masaharu Takahashi, 5-4-12, Midorigaoka, Yachiyo-shi, Chiba 276-0049 (JP)

(73) Assignees: Tokyo Electron Limited, Tokyo (JP); Makoto Ando, Kanagawa (JP); Masaharu Takahashi, Chiba (JP)

( * ) Notice: Subject to any disclaimer, the term of this patent is extended or adjusted under 35 U.S.C. 154(b) by 112 days.

(21) Appl. No.: 10/466,602

(22) PCT Filed: Jan. 18, 2002

(86) PCT No.: PCT/JP02/00323

§ 371 (c)(1),
(2), (4) Date: Dec. 22, 2003

(87) PCT Pub. No.: WO02/058441

PCT Pub. Date: Jul. 25, 2002

(65) Prior Publication Data

US 2004/0095074 A1    May 20, 2004

(30) Foreign Application Priority Data

Jan. 18, 2001   (JP)   ............................. 2001-010291
Aug. 17, 2001   (JP)   ............................. 2001-247853

(51) Int. Cl.
C23C 16/00    (2006.01)
C23F 1/00    (2006.01)
H01L 21/306    (2006.01)

(52) U.S. Cl. ...................... 118/723 MW; 118/723 MA; 118/723 AN; 156/345.36; 156/345.41; 156/345.42

(58) Field of Classification Search ....... 118/723 MW; 156/345.36, 345.41
See application file for complete search history.

(56) References Cited

U.S. PATENT DOCUMENTS 3,899,759 A * 8/1975 Hines et al. ................ 333/212

(Continued)

FOREIGN PATENT DOCUMENTS

JP    2000-073175 A    3/1990

(Continued)

OTHER PUBLICATIONS

Denshi Zairyo, Mar. 2000, Dry Etching Apparatus With New Plasma Source "Pantheon Series", pp. 69-73, 120.

(Continued)

*Primary Examiner*—Parviz Hassanzadeh
*Assistant Examiner*—Rakesh K Dhingra
(74) *Attorney, Agent, or Firm*—Finnegan, Henderson, Farabow, Garrett & Dunner, L.L.P.

(57) ABSTRACT

A plasma device includes a slot antenna (30) for supplying a high frequency electromagnetic field (F) supplied through a feeding part into a processing vessel (11). The feeding part has a cavity (35) for forming a resonator and converting the fed high frequency electromagnetic field (F) into a rotating electromagnetic field and supplying the rotating electromagnetic field to the slot antenna (30).

20 Claims, 15 Drawing Sheets

U.S. PATENT DOCUMENTS

| | | | |
|---|---|---|---|
| 4,686,494 A * | 8/1987 | Kaneko et al. | 333/137 |
| 5,134,965 A * | 8/1992 | Tokuda et al. | 118/723 MW |
| 5,647,944 A * | 7/1997 | Tsubaki et al. | 156/345.41 |
| 5,891,252 A | 4/1999 | Yokogawa et al. | |
| 5,900,699 A | 5/1999 | Samukawa et al. | |
| 5,954,882 A * | 9/1999 | Wild et al. | 118/723 MW |
| 6,158,383 A | 12/2000 | Watanabe et al. | |
| 6,222,170 B1 * | 4/2001 | Tucker et al. | 219/748 |
| 6,355,573 B1 * | 3/2002 | Okumura et al. | 438/709 |

FOREIGN PATENT DOCUMENTS

| | | | |
|---|---|---|---|
| JP | 02-138735 A | | 5/1990 |
| JP | 03133201 A | * | 6/1991 |
| JP | 0 674 334 A1 | | 9/1995 |
| JP | 09-102400 A | | 4/1997 |
| JP | 09-270386 A | | 10/1997 |
| JP | 10-012396 A | | 1/1998 |
| JP | 10-107011 | | 4/1998 |
| JP | 11-195500 | | 7/1999 |
| JP | 11-195500 A | | 7/1999 |
| JP | 11-297494 | | 10/1999 |
| JP | 11-297494 A | | 10/1999 |
| JP | 2000012290 A | * | 1/2000 |
| JP | 2000-073175 | | 3/2000 |
| JP | 2000-223298 | | 8/2000 |
| JP | 2000-223298 A | | 8/2000 |
| JP | 2000-323458 A | | 11/2000 |
| JP | 2000-357683 | | 12/2000 |
| JP | 2000-357683 A | | 12/2000 |
| JP | 2001-223171 A | | 8/2001 |
| JP | 2001-345312 A | | 12/2001 |
| JP | 2002-060953 A | | 2/2002 |

OTHER PUBLICATIONS

English translation of PCT International Preliminary Examination Report.

Supplementary European Search Report for Application No. 02715809.6-2208 PCT/JP0200323, dated Feb. 10, 2006.

Yashiro et al , "Dry Etching Apparatus Equipped with a New Plasma Source" ("Atarashii Plasma Gen o Tosai shita Dry Etching Sochi"),Electronic Materials (Denshi Zairyo), vol. 39, No. 3, 2000, pp. 69-73.

* cited by examiner

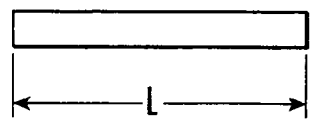
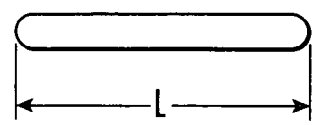
FIG.19A  FIG.19B
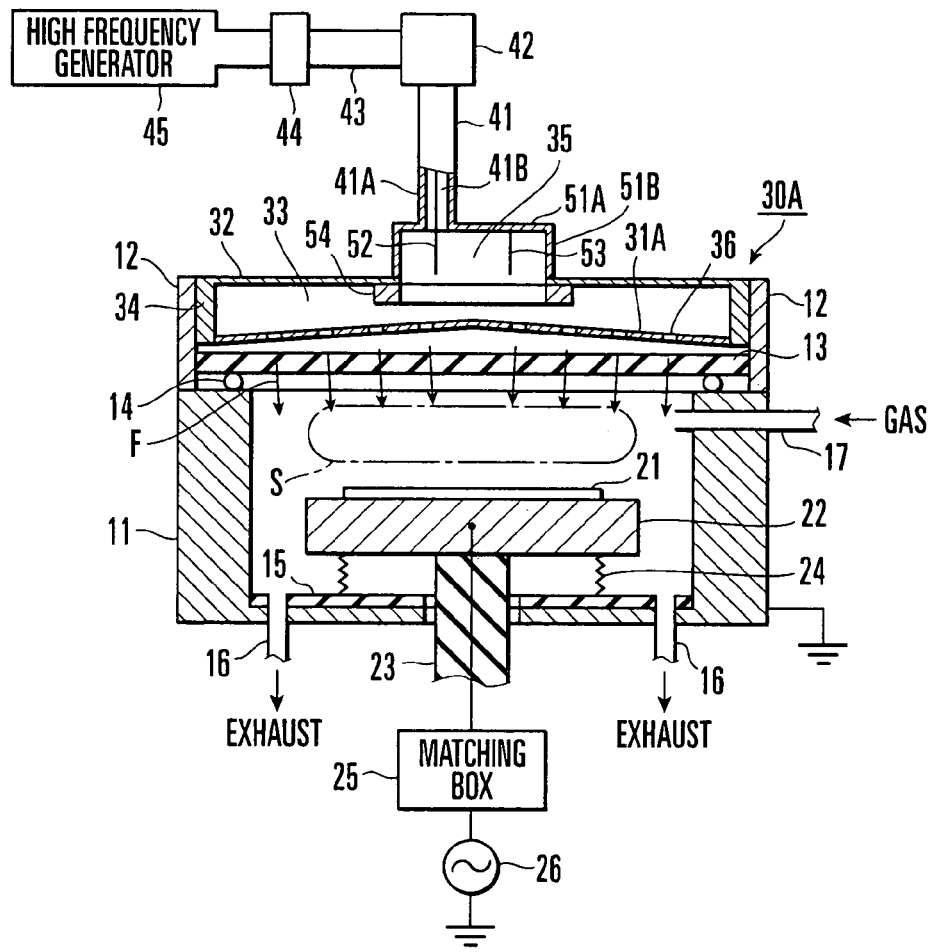
FIG.20A
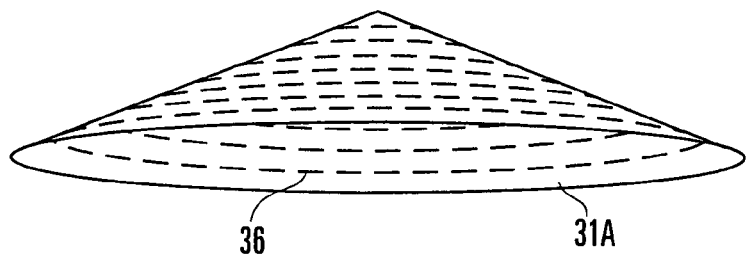
FIG.20B

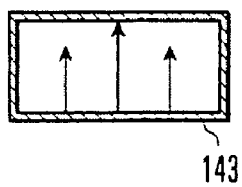
FIG.22A
(PRIOR ART)
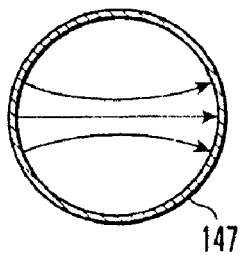 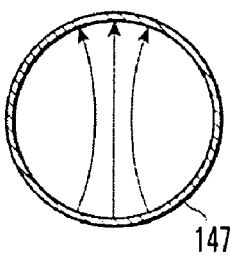 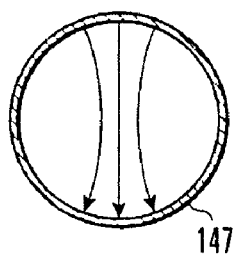
FIG.22B    FIG.22E    FIG.22F
(PRIOR ART)   (PRIOR ART)   (PRIOR ART)
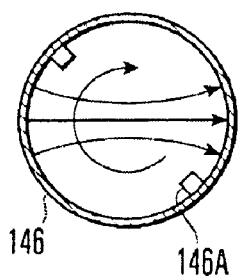 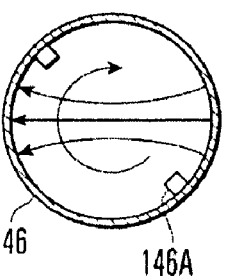 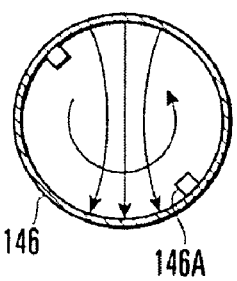
FIG.22C    FIG.22D    FIG.22G
(PRIOR ART)   (PRIOR ART)   (PRIOR ART)
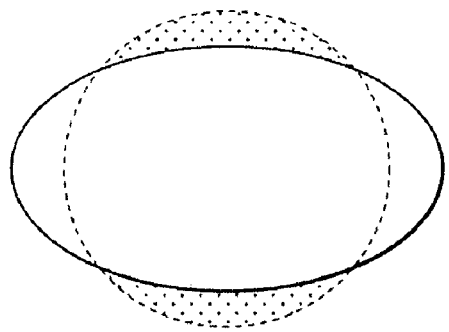
FIG.23
(PRIOR ART)

PLASMA DEVICE AND PLASMA GENERATING METHOD

BACKGROUND OF THE INVENTION

The present invention relates to a plasma device and plasma generating method for generating a plasma by an electromagnetic field supplied into a processing vessel by using a slot antenna.

In the manufacture of a semiconductor device or flat panel display, plasma devices are used often to perform processes such as formation of an oxide film, crystal growth of a semiconductor layer, etching, and ashing. Among the plasma devices, a high frequency plasma device is available which supplies a high frequency electromagnetic field into a processing vessel by using a slot antenna and generates a high-density plasma with the electromagnetic field. The high frequency plasma device is characterized in that it can stably generate a plasma even if the pressure of the plasma gas is comparatively low.

When various types of processes are to be performed by using the plasma device, the two-dimensional distribution (to be referred to as "surface distribution" hereinafter) of the plasma on a processing surface of a semiconductor substrate or the like must be uniformed.

As a method of generating a plasma having a uniform surface distribution by using a slot antenna, a high frequency electromagnetic field fed from a high frequency power supply may be converted into a rotating electromagnetic field, and the circularly polarized rotating high frequency electromagnetic field may be supplied to the slot antenna.

FIG. 21 is a view showing an arrangement of a conventional high frequency plasma device. FIG. 21 shows the longitudinal sectional structure of the arrangement of part of the conventional high frequency plasma device.

The conventional plasma device has a bottomed cylindrical processing vessel 111 with an upper opening, a dielectric plate 113 for closing the upper opening of the processing vessel 111, and a radial antenna 130 arranged above the dielectric plate 113 to radiate a high frequency electromagnetic field into the processing vessel 111.

A substrate table 122 is fixed to the bottom of the processing vessel 111, and a substrate 121 as a target object is arranged on the mount surface of the substrate table 122. Exhaust ports 116 for vacuum exhaustion are formed in the bottom of the processing vessel 111, and a nozzle 117 for supplying a plasma gas and process gas is formed in the side wall of the processing vessel 111.

The dielectric plate 113 is made of silica glass or the like. A seal member (not shown) such as an O-ring is interposed between the dielectric plate 113 and processing vessel 111, so that the plasma in the processing vessel 111 will not leak to the outside.

The radial antenna 130 is a kind of slot antennas, and is formed of two parallel circular conductor plates 131 and 132 which form a radial waveguide 133, and a conductor ring 134 which connects the edge portions of the conductor plates 131 and 132. An inlet 135 for introducing the high frequency electromagnetic field into the radial antenna 130 is formed at the center of the conductor plate 132 serving as the upper surface of the radial waveguide 133. A plurality of slots 136 for radiating an electromagnetic field F, which propagates in the radial waveguide 133, into the processing vessel 111 through the dielectric plate 113 are formed in the circumferential direction in the conductor plate 131 serving as the lower surface of the radial waveguide 133, thus forming the antenna surface of the radial antenna 130. The outer portions of the radial antenna 130 and dielectric plate 113 are covered by an annular shield material 112. Thus, the electromagnetic field will not leak to the outside.

In the conventional plasma device, the rotating electromagnetic field is supplied to the radial antenna 130 with the above arrangement.

More specifically, in order to supply a rotating electromagnetic field, the conventional plasma device has a high frequency generator 145 for generating a high frequency electromagnetic field, a rectangular waveguide 143 for guiding the high frequency electromagnetic field output from the high frequency generator 145, a rectangular cylindrical converter 147 for connecting the rectangular waveguide and a cylindrical waveguide, and a circular polarization converter 146 for converting a linearly polarized high frequency electromagnetic field into a rotating electromagnetic field.

As the circular polarization converter 146, for example, one having one or the plurality of sets of axial cylindrical stubs 146A made of conductors on the inner wall of a cylindrical waveguide to oppose each other is used, as shown in FIG. 22(c). The cylindrical stubs 146A are arranged in directions to form 45° with the main direction of the electric field of a TE11-mode electromagnetic field input from the rectangular cylindrical converter 147. When the plurality of sets of cylindrical stubs 146A are arranged, they are provided at an interval of $\lambda/4$ ($\lambda$ is the guide wavelength of the propagating electromagnetic wave) in the axial direction, and convert the TE11-mode high frequency electromagnetic field into a rotating electromagnetic field the main direction of the electric field of which rotates about the axis of the cylindrical waveguide as the center.

In the conventional plasma device with the above arrangement, how the rotating electromagnetic field is supplied will be described as follows with reference to FIG. 22. FIG. 22 includes views schematically showing how the electromagnetic field propagates in the rectangular waveguide 143, rectangular cylindrical converter 147, and circular polarization converter 146. FIG. 22(a) shows the state of the electric field taken along A-A' of the electromagnetic field which propagates in the rectangular waveguide 143 shown in FIG. 21, FIGS. 22(b), 22(e), and 22(f) each show the state of the electric field taken along an outlet B-B' of the rectangular cylindrical converter 147, and FIGS. 22(c), 22(d), and 22(g) each show the electric field and the rotating direction of the electromagnetic field propagating in the circular polarization converter 146.

The high frequency electromagnetic field (FIG. 22(a)) which has propagated in the rectangular waveguide 143 from the high frequency generator 145 with the TE10 mode is converted by the rectangular cylindrical converter 147 into the TE11 mode (FIG. 22(b)), and is introduced into the cylindrical waveguide of the circular polarization converter 146. The high frequency electromagnetic field is then converted into a rotating electromagnetic field while propagating in the circular polarization converter 146 (FIG. 22(c)), and is supplied into the radial antenna 130 through the inlet 135 formed at the center of the conductor plate 132.

The rotating electromagnetic field supplied to the radial antenna 130 is, however, partly reflected by the conductor ring 134 located at the end of the radial waveguide 133. The reflected rotating electromagnetic field propagates in the circular polarization converter 146 in the opposite direction while rotating in the same direction (FIG. 22(d)). The reflected electromagnetic field is then reflected at the fixed end of the rectangular cylindrical converter 147 (FIGS. 22(e) and 22(f)), forms a rotating electromagnetic field rotating in the opposite direction to propagate in the circular polarization converter 146 (FIG. 22(g)), and is supplied to the radial antenna 130.

As a result, rotating electromagnetic fields having different phases and rotating directions are supplied to the radial antenna 130 in a mixed state. The polarized wave of the high frequency electromagnetic field at this time forms an ellipse as shown in FIG. 23. This decreases the surface distribution uniformity of the plasma generated in the processing vessel, and nonuniformity occurs in the plasma process particularly at the peripheral portion.

In this manner, if the rotating electromagnetic field converted by the circular polarization converter 146 is merely supplied to the radial antenna 130, it is difficult to obtain the surface uniformity of the plasma distribution due to the influence of the reflected electromagnetic field from the radial antenna 130.

SUMMARY OF THE INVENTION

The present invention has been made to solve the above drawback, and has as its object to improve the surface uniformity of the plasma distribution.

In order to achieve the above object, a plasma device according to the present invention is characterized by comprising a slot antenna formed in a waveguide to which a high frequency electromagnetic field is supplied through a feeding part, and a processing vessel in which a plasma is generated by a high frequency electromagnetic field supplied through the slot antenna, wherein the feeding part has a cavity for forming a resonator and converting the fed high frequency electromagnetic field into a rotating electromagnetic field and supplying the rotating electromagnetic field to the waveguide. According to the present invention, while the rotating electromagnetic field resonates in the cavity, a circularly polarized rotating high frequency electromagnetic field is supplied into the waveguide.

According to the present invention, while the rotating electromagnetic field resonates in the cavity, a circularly polarized rotating high frequency electromagnetic field is supplied into the waveguide.

The plasma device may comprise a ring member formed around an opening of the cavity in the waveguide and having an inner diameter which is the same as that of the cavity. When the thickness and width of the ring member are adjusted, of the high frequency electromagnetic field resonating in the cavity, the proportion of the high frequency electromagnetic field to be supplied into the waveguide can be adjusted.

The first arrangement of the plasma device according the present invention is characterized in that the cavity is formed of a circular conductor member connected to an outer conductor of a coaxial waveguide for feeding a high frequency electromagnetic field, and a cylindrical conductor member having one end connected to the circular conductor member and the other end that opens in the waveguide, and the plasma device comprises a feeding pin provided at a position separate from a center of the circular conductor member in a radial direction thereof and having one end connected to an inner conductor of the coaxial waveguide, and a perturbation pin provided at a position that forms a predetermined angle with the feeding pin through a center of the circular conductor member and having one end connected to the circular conductor member. In this arrangement, the high frequency electromagnetic field fed through the coaxial waveguide is converted into a rotating magnetic field by interaction of the feeding pin and perturbation pin, and is supplied into the waveguide while resonating in the cavity.

The other end of the feeding pin may be open, or be connected to an antenna surface having a slot which forms the slot antenna. When the other end of the feeding pin is connected to the antenna surface, the other end of the feeding pin may be provided with a frustoconical conductive member spreading toward the antenna surface. When the conductor member having this shape is used, the high frequency electromagnetic field resonating in the cavity can be introduced into the waveguide easily.

The other end of the perturbation pin may also be open, be connected to the antenna surface, or be connected to the cylindrical conductor member.

The other end of the feeding pin may be connected to the cylindrical conductor member. In this case, the other end of the perturbation pin may be connected to an antenna surface having slots which form the slot antenna, or to the cylindrical conductor member.

The second arrangement of the plasma device according the present invention is characterized in that the cavity is formed of a circular conductor member connected to an outer conductor of a coaxial waveguide for feeding a high frequency electromagnetic field, a cylindrical conductor member having one end connected to the circular conductor member and the other end that opens in the waveguide, and a conductive member oppositely arranged inside a side wall of the cylindrical conductor member, and the plasma device comprises a feeding pin provided at a position separate from a center of the circular conductor member in a radial direction thereof and having one end connected to an inner conductor of the coaxial waveguide. In this arrangement, the cavity is formed such that because of the conductive member oppositely arranged inside the side wall of the cylindrical conductor member, the section of the cylindrical conductor member perpendicular to its axis has opposing notched portions. As a result, the high frequency electromagnetic field fed through the coaxial waveguide is converted into a rotating electromagnetic field in the cavity, and supplied, while rotating, into the waveguide.

The conductive member oppositely arranged inside the side wall of the cylindrical conductor member may extend from one end to the other end of the cylindrical conductor member.

A length of the conductive member in an axial direction of the cylindrical conductor member may be substantially ¼ a wavelength of the high frequency electromagnetic field. In this case, the lengths of portions of the conductive member and the feeding pin which are parallel to each other are substantially ¼ the wavelength of the high frequency electromagnetic field. Thus, a good rotating electromagnetic field can be obtained in the cavity.

An end of the conductive member which is close to the waveguide may be molded to form a slope. When the conductive member is molded in this manner, a change in impedance in the cavity between a region where the conductive member is present and a region where it is not can be moderated, so that reflection of the high frequency electromagnetic field at the boundary of the two regions can be suppressed.

When the end of the conductive member is molded to form a slope, the length of the main body of the conductive member excluding an end thereof in an axial direction of the cylindrical conductor member may be substantially ¼ the wavelength of the high frequency electromagnetic field.

Then, a good rotating electromagnetic field can be obtained in the cavity.

The other end of the feeding pin may be connected to an antenna surface having slots for forming the slot antenna, or to the conductor member at a position separate from the circular conductor member in an axial direction of the cylindrical conductor member by substantially ¼ a wavelength of the high frequency electromagnetic field.

As the conductive member to be provided inside the side wall of the cylindrical conductor member, one or a plurality of sets of opposing cylindrical stubs made of conductors may be formed in the axial direction.

The third arrangement of the plasma device according to the present invention is characterized in that the cavity is formed of an elliptic conductor member connected to an outer conductor of a coaxial waveguide for feeding a high frequency electromagnetic field, and a cylindrical conductor member with an elliptic section and having one end connected to the elliptic conductor member and the other end that opens in the waveguide, and the plasma device comprises a feeding pin provided at a position separate from a center of the elliptic conductor member in a radial direction thereof to form a predetermined angle with each of major and minor diameters of the elliptic conductor member and connected to an inner conductor of the coaxial waveguide. With this arrangement, the high frequency electromagnetic field fed through the coaxial waveguide is converted into a rotating electromagnetic field in the cavity having the elliptic section, and is supplied, while resonating, into the waveguide.

The other end of the feeding pin may be connected to an antenna surface having a slot for forming the slot antenna, or to the conductor member at a position separate from the circular conductor member in an axial direction of the cylindrical conductor member by substantially ¼ a wavelength of the high frequency electromagnetic field.

The fourth arrangement of the plasma device according to the present invention is characterized in that the cavity is formed of a circular conductor member connected to outer conductors of first and second coaxial waveguides for feeding high frequency electromagnetic fields, and a cylindrical conductor member having one end connected to the circular conductor member and the other end that opens in the waveguide, and the plasma device comprises a first feeding pin provided at a position separate from a center of the circular conductor member in a radial direction thereof and connected to an inner conductor of the first coaxial waveguide, and a second feeding pin provided at a position to form a predetermined angle with the first feeding pin through a center of the circular conductor member and connected to an inner conductor of the second axial waveguide. With this arrangement, when high frequency electromagnetic fields having different phases are fed to the first and second feeding pins, a rotating electromagnetic field is generated. The rotating electromagnetic field is supplied, while rotating in the cavity, into the waveguide.

The other end of each of the first and second feeding pins may be connected to an antenna surface having slots for forming the slot antenna, or to the conductor member at a position separate from the circular conductor member in an axial direction of the cylindrical conductor member by substantially ¼ a wavelength of the high frequency electromagnetic field.

The fifth arrangement of the plasma device according to the present invention is characterized in that the cavity is formed of a circular conductor member connected to an outer conductor of at least one coaxial waveguide for feeding a high frequency electromagnetic field, and a cylindrical conductor member having one end connected to the circular conductor member and the other end that opens in the waveguide, and the plasma device comprises a patch antenna for radiating the high frequency electromagnetic field fed from at least one coaxial waveguide into the cavity as a rotating electromagnetic field, the patch antenna including the circular conductor member and a conductor plate opposedly arranged at a predetermined gap from the circular conductor member and connected to an inner conductor of at least one coaxial waveguide. With this arrangement, the high frequency electromagnetic field fed through the coaxial waveguide is radiated as the rotating electromagnetic field by the patch antenna into the cavity, and is supplied, while resonating, into the waveguide.

The sixth arrangement of the plasma device according to the present invention is characterized in that the cavity is formed of one side surface or terminal end face of a rectangular waveguide for feeding a high frequency electromagnetic field, and a cylindrical conductor member having one end connected to one side surface or terminal end face of the rectangular waveguide and the other end that opens in the waveguide, and a plurality of slots for radiating the high frequency electromagnetic field into the cavity as a rotating electromagnetic field are formed in one side surface or terminal end face of the rectangular waveguide. With this arrangement, the high frequency electromagnetic field fed through the rectangular waveguide is radiated as the rotating electromagnetic field into the cavity through the plurality of slots formed in one side surface or terminal end face of the rectangular waveguide, and is supplied, while resonating, into the waveguide.

The plurality of slots may be two slots intersecting at mid points thereof. A slot formed of the two slots will be called a cross slot. The plurality of slots may be two slots arranged separate from each other and extending in directions substantially nearly perpendicular to each other. A slot formed of the two slots will be called an inverted-V-shaped slot.

A plasma generating method according to the present invention is characterized in that a high frequency electromagnetic field is fed to a cavity for forming a resonator, the high frequency electromagnetic field is converted into a rotating electromagnetic field, simultaneously the high frequency electromagnetic field that has been converted into the rotating electromagnetic field is supplied to a waveguide while resonating in the cavity, and the high frequency electronmagnetic field that has been supplied to the waveguide is supplied to a processing vessel through a slot antenna formed in the waveguide, thereby generating a plasma. With this method, the rotating electromagnetic field is supplied, while being resonated, to the waveguide. Thus, the high frequency electromagnetic field to be supplied to the waveguide can be a circularly polarized rotating electromagnetic field.

According to the first arrangement of the plasma generating method of the present invention, a feeding pin and perturbation pin are provided in the cavity that forms a resonator, so that a high frequency electromagnetic field fed through a coaxial waveguide is converted into a rotating electromagnetic field and resonated in the cavity.

According to the second arrangement of the plasma generating method of the present invention, a high frequency electromagnetic field is fed to a cavity, whose section perpendicular to the propagating direction of the high frequency electromagnetic field has opposing notches, through a coaxial waveguide, so that the high frequency electromagnetic field is converted into a rotating electromagnetic field and resonated in the cavity.

According to the third arrangement of the plasma generating method of the present invention, a high frequency electromagnetic field is fed to a cavity, whose section perpendicular to the propagating direction of the high frequency electromagnetic field is elliptic, through a coaxial waveguide, so that the high frequency electromagnetic field is converted into a rotating electromagnetic field and resonated in the cavity.

According to the fourth arrangement of the plasma generating method of the present invention, high frequency electromagnetic fields having phases different from each other by 900 are fed to the cavity that forms a resonator, through first and second coaxial waveguides, so that a rotating electromagnetic field is generated and resonated in the cavity.

According to the fifth arrangement of the plasma generating method of the present invention, a high frequency electromagnetic fields is fed to a patch antenna through a coaxial waveguide, so that a rotating electromagnetic field is generated in the cavity.

According to the sixth arrangement of the plasma generating method of the present invention, a high frequency electromagnetic field fed from a rectangular waveguide is radiated into the cavity through the plurality of slots formed in one side surface or terminal end face of the rectangular waveguide, so that a rotating electromagnetic field is generated.

BRIEF DESCRIPTION OF THE DRAWINGS

FIG. 19 includes plan views each showing the shape of a slot;

FIG. 20 includes views for explaining an arrangement of a radial antenna that can be used in the present invention;

FIG. 22 includes views for explaining modes of an electromagnetic field in the conventional plasma device; and FIG. 23 is a schematic view showing the surface distribution of a plasma in the conventional plasma device.

DESCRIPTION OF THE PREFERRED
EMBODIMENTS

The embodiments of the present invention will be described with reference to the drawings.

Figure 1A:
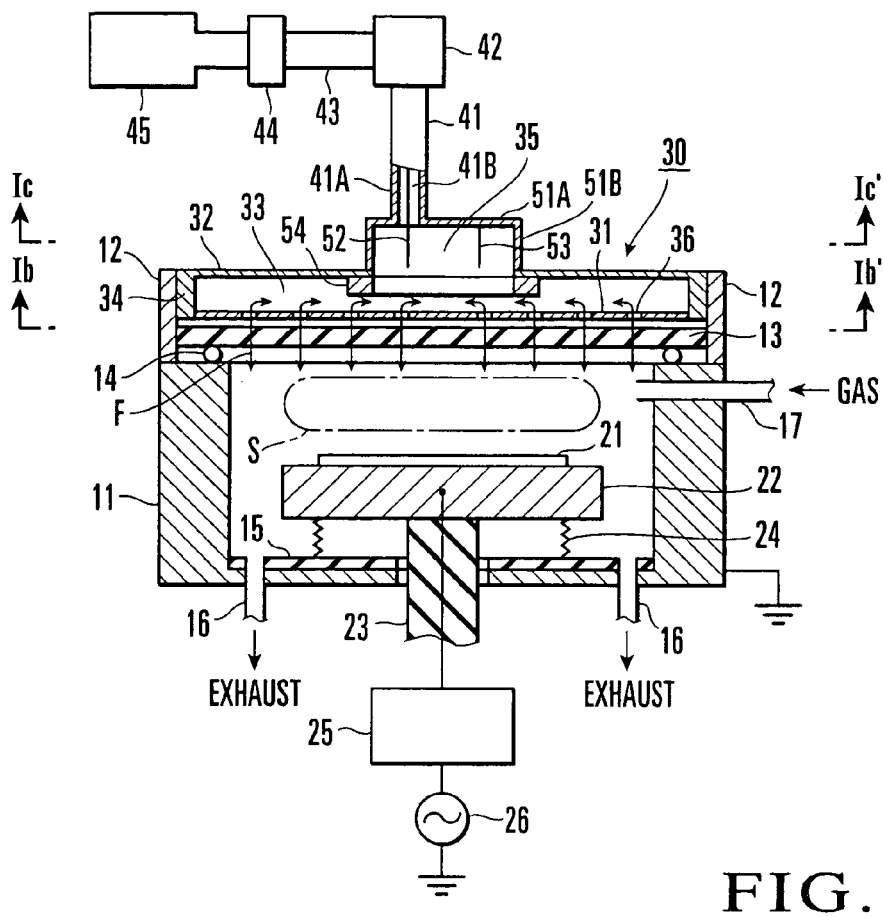
FIG. 1 includes views for explaining a plasma device according to the first embodiment of the present invention.
Figure 2A:
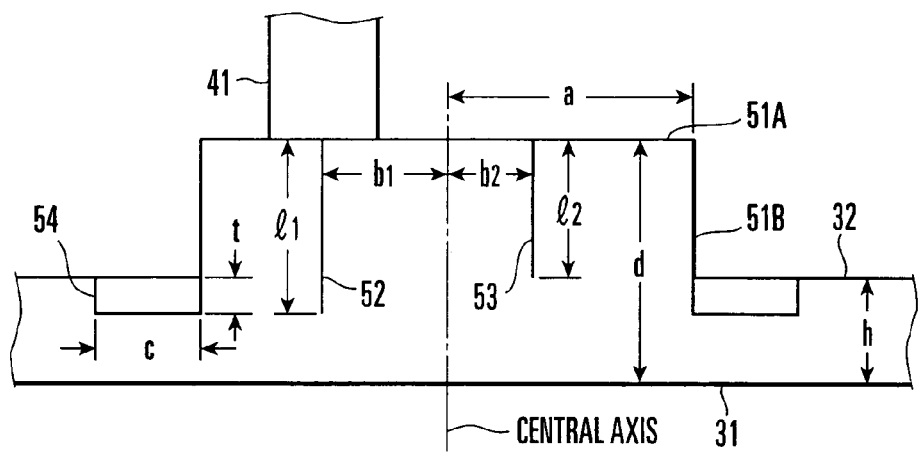
FIG. 2 includes views for explaining a feeding part in the plasma device according to the first embodiment of the present invention.
Figure 2B:
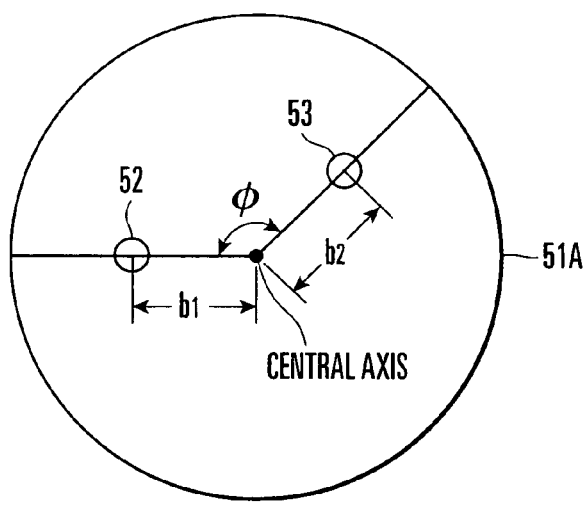
Figure 3:
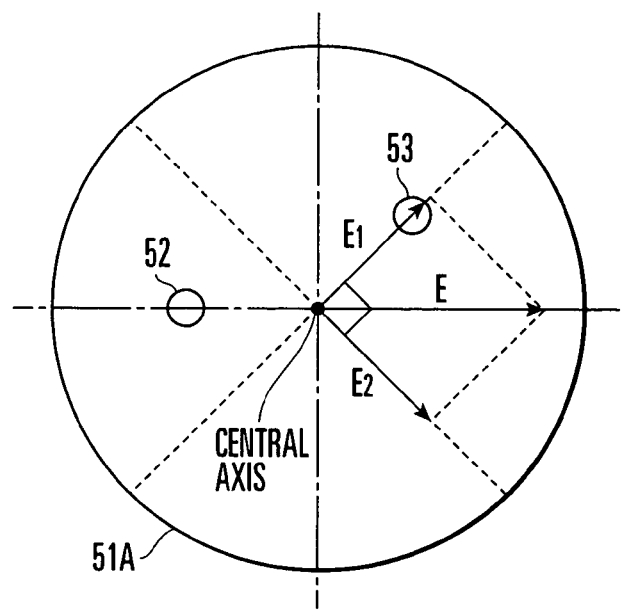
FIG. 3 is a view for explaining the electric field distribution in the feeding part of the plasma device according to the first embodiment of the present invention.

FIGS. 1 to 3 include views for explaining a plasma device according to the first embodiment of the present invention.

As shown in FIG. 1(*a*), this plasma device has a bottomed cylindrical processing vessel 11 with an upper opening, a dielectric plate 13 for closing the upper opening of the processing vessel 11, a radial antenna 30 arranged above the dielectric plate 13 to radiate (or leak) a high frequency electromagnetic field into the processing vessel 11, and a shield material 12 for covering the outer portions of the radial antenna 30 and dielectric plate 13. A seal member 14 such as an O-ring is interposed between the processing vessel 11 and dielectric plate 13, so that the vacuum in the processing vessel 11 is maintained and the plasma will not leak to the outside.

A substrate table 22 for placing thereon a substrate 21 as a target object is provided in the processing vessel 11 to be vertically movable through an elevating shaft 23. The substrate table 22 is electrically connected to a bias high frequency power supply 26 through a matching box 25. In order to keep the hermeticity of the processing vessel 11, a bellows 24 connected to the bottom surface of the substrate table 22 and to an insulator plate 15 provided to the bottom surface of the processing vessel 11 is formed around the elevating shaft 23.

The processing vessel 11 also has exhaust ports 16 for vacuum exhaustion and a nozzle 17 for supplying a plasma gas and process gas.

The radial antenna 30 is formed of two parallel circular conductor plates 31 and 32 which form a radial waveguide 33, and a conductor ring 34 which connects the outer portions of the conductor plates 31 and 32.

Figure 1B:
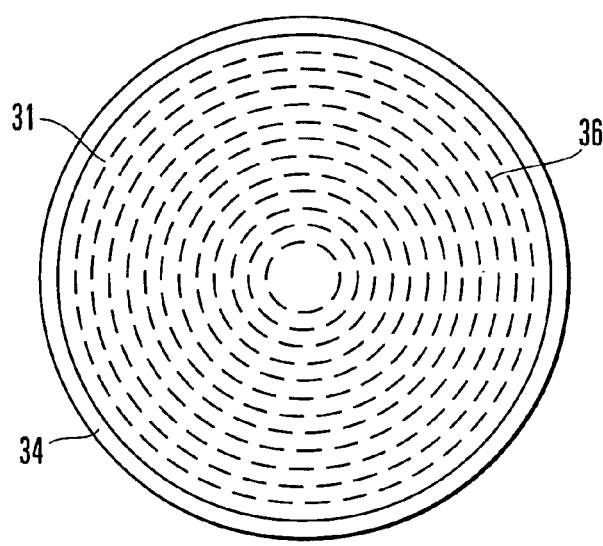

FIG. 1(*b*) is a sectional view of the plasma device shown in FIG. 1(*a*) taken along the line lb-lb'. The conductor plate 31 serving as the lower surface of the radial waveguide 33 has the plurality of slots 36 in the circumferential direction as shown in, e.g., FIG. 1(b), to form the antenna surface of the radial antenna 30. The plurality of slots 36 formed in the conductor plate 31 form a slot antenna.

The conductor plate 32 serving as the upper surface of the radial waveguide 33 has a feeding part (to be described later) at its center.

As shown in FIG. 1(a), a high frequency electromagnetic field generated by a high frequency generator 45 propagates in a rectangular waveguide 43 through a matching circuit 44, is converted by a rectangular coaxial converter 42 from the TE10 mode to the TEM mode, and is supplied to the feeding part of the radial antenna 30 through a coaxial waveguide 41.

Figure 1C:
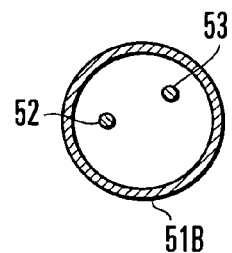

In this embodiment, the feeding part is comprised of a cavity 35, formed of a circular conductor member 51A connected to an outer conductor 41A of the coaxial waveguide 41 for feeding the high frequency electromagnetic field and a cylindrical conductor member 51B having one end connected to the circular conductor member 51A and the other end that opens in the radial antenna 30, a feeding pin 52 provided in the cavity 35 and having one end connected to an inner conductor 41B of the coaxial waveguide 41 and the other end that is open, and a perturbation pin 53 having one end connected to the circular conductor member 51A and the other end that is open. The feeding pin 52 and perturbation pin 53 convert the electromagnetic field supplied through the coaxial waveguide 41 into a rotating electromagnetic field. FIG. 1(c) is a sectional view taken along the line Ic-Ic' of FIG. 1(a).

The cavity 35 forms a resonator together with the conductor plate 31 of the radial antenna 30. The high frequency electromagnetic field resonating in the cavity 35 is partly supplied to the radial waveguide 33.

A ring member 54 having the same inner diameter as the inner diameter of the cylindrical conductor member 51B (i.e., the inner diameter of the cavity 35) is arranged around the opening of the cavity 35 formed at the center of the conductor plate 32 of the radial antenna 30. When the thickness and width of the ring member 54 are adjusted, of the high frequency electromagnetic field resonating in the cavity 35, the proportion of the high frequency electromagnetic field to be supplied to the radial waveguide 33 can be adjusted.

A value obtained by dividing, of the electromagnetic field supplied to the cavity 35, the energy of the electromagnetic field resonating and remaining in the cavity 35 by the energy of the electromagnetic field supplied from the cavity 35 to the radial waveguide 33 is called "Q-value".

The arrangement of this feeding part will be described in detail with reference to FIG. 2.

FIG. 2(a) is a schematic view of the feeding part seen from the side surface, and FIG. 2(b) is a schematic view showing the positions of the feeding pin 52 and perturbation pin 53.

In this embodiment, assuming that the high frequency generator 45 feeds a high frequency electromagnetic field of 2.45 GHz, a distance (to be referred to as "cavity diameter" hereinafter) a from the central axis of the cylindrical cavity 35 (to be referred to as "central axis" hereinafter) to the inner surface of the cylindrical conductor member 51B can be set to about 7.3 cm to 7.5 cm, and a distance (to be referred to as "cavity depth" hereinafter) d between the circular conductor member 51A and the conductor plate 31 of the radial antenna 30 can be set to about 3.6 cm. At this time, the diameter of the radial antenna 30 is about 48 cm, and a height h as the distance between the conductor plates 31 and 32 is 1.5 cm to 1.6 cm.

A width c of the ring member 54 which forms the cavity 35 together with the cylindrical conductor member 51B is about 3.1 cm. This corresponds to about ¼ the wavelength of the electromagnetic wave.

A length $l_1$ of the feeding pin 52 connected to the inner conductor 41B of the coaxial waveguide 41 can be set to 1.75 cm to 2.6 cm, and a length $l_{22}$ of the perturbation pin 53 can be set to 1.75 cm to 2.1 cm. At this time, the feeding pin 52 is preferably designed to be slightly longer than the perturbation pin 53.

When the pins 52 and 53 are made longer or the cavity 35 is made deeper, the Q-value of the cavity 35 becomes large, so that the proportion of the electromagnetic field to be supplied to the radial waveguide 33 can be decreased. To use the present invention as a plasma device, the Q-value should be about 30.

The feeding pin 52 and perturbation pin 53 are arranged at positions satisfying $b_1=b_2=$about 3.6 cm from the central axis of the circular conductor member 51A, as shown in FIG. 2(b), to form an angle as an odd multiple of 45°, e.g., $\phi=135°$, through the center of the conductor member 51A. Thus, the high frequency electromagnetic field fed through the coaxial waveguide 41 is converted in the cavity 35 into a TM-mode rotating electromagnetic field.

The dimensions of the feeding part described herein are obtained by designing while attaching importance to a reflection coefficient (VS), but the present invention is not limited to them naturally. For example, when attaching importance to the axial ratio of the rotating magnetic field, in FIG. 2, the feeding pin 52 and perturbation pin 53 may be arranged at positions that satisfy a=about 7.3 cm, d=about 3.5 cm, c=about 2.6 cm, t=about 1.0 cm, $l_1=l_2=$about 1.5 cm, $b_1=$about 4.3 cm, and $b_2=$about 4.4 cm, such that $\phi=135°$.

Referring to FIG. 3, the mechanism with which the feeding pin 52 and perturbation pin 53 generate the rotating electromagnetic field can be described as follows.

Without the perturbation pin 53, the electric field generated by the feeding pin 52 might be as indicated by E (broken line) in FIG. 3, and no rotating electromagnetic field can be obtained.

In contrast to this, with the perturbation pin 53, of the electric field E, a component E1 in a direction toward the perturbation pin 53 is adversely affected by the capacitive component between the feeding pin 52 and perturbation pin 53, so that it is phase-delayed. When the lengths of the feeding pin 52 and perturbation pin 53 are adjusted such that the phase delay becomes 90°, a TM11-mode rotating electromagnetic field can be obtained.

Therefore, in this plasma device, the high frequency electromagnetic field generated by the high frequency generator 45 is fed to the cavity 35 through the coaxial waveguide 41, and is converted into the rotating electromagnetic field by the feeding pin 52 and perturbation pin 53. Simultaneously, the high frequency electromagnetic field is partly supplied to the radial waveguide 33 of the radial antenna 30 while it resonates in the cavity 35. The high frequency electromagnetic field supplied into the radial antenna 30 propagates in the radial waveguide 33. An electromagnetic field F propagating in the radial waveguide 33 radiates (or leaks) through the slots 36 into the processing vessel 11, and ionizes the plasma gas introduced into the processing vessel 11 through the nozzle 17, thus generating a plasma S.

At this time, as the rotating electromagnetic field resonates in the cavity 35, the rotating electromagnetic field resonates in the cavity 35 is supplied to the radial waveguide 33. Therefore, when the high frequency electromagnetic field is converted into a circularly polarized wave by the feeding pin 52 and perturbation pin 53, the radial antenna 30 radiates (or leaks) a good circularly polarized high frequency electromagnetic field into the processing vessel 11, so that the surface distribution uniformity of the plasma S to be generated can be improved.

In this embodiment, the other end (distal end) of the feeding pin 52, one end of which is connected to the inner conductor 41B of the coaxial waveguide 41, is open, and the electromagnetic field is excited with the voltage mode. Thus, the voltage amplitude becomes maximum at the distal end of the feeding pin 52. When feeding with a high power of several kW to several ten kW, the feeding part is preferably designed such that electric discharge does not occur between the distal end of the feeding pin 52 and the distal end of the perturbation pin 53, the cylindrical conductor member 51B of the cavity 35, or the conductor plate 31 of the radial antenna 30. To suppress electric discharge, the distance from the distal end of the feeding pin 52 to the distal end of the perturbation pin 53, the cylindrical conductor member 51B, or the conductor plate 31 may be increased. The feeding pin 52 and perturbation pin 53 can have different lengths.

Figure 4:
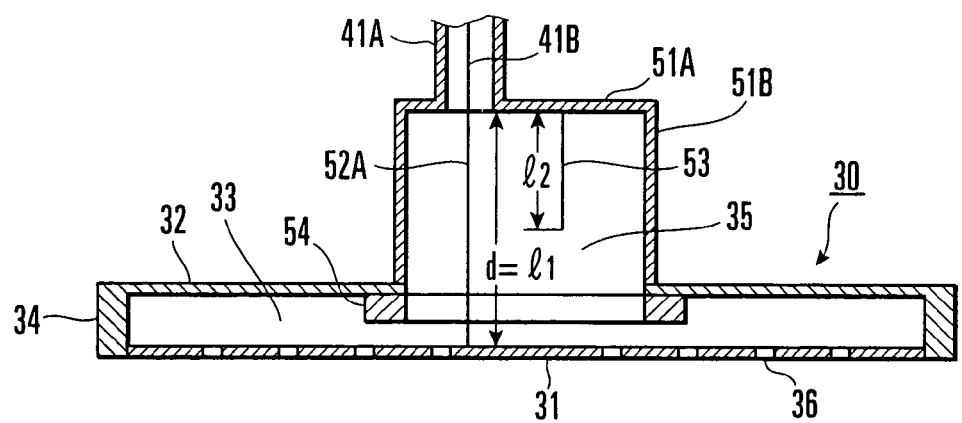
FIG. 4 is a view for explaining a feeding part in a plasma device according to the second embodiment of the present invention.

The second embodiment of the present invention will be described with reference to FIG. 4. Members that are common to the first embodiment are denoted by the same reference numerals, and a description thereof will be omitted.

In the first embodiment described above, the distal end of the feeding pin 52 provided in the perturbation pin 53 is open. In contrast to this, in a plasma device according to the second embodiment, the distal end of a feeding pin 52A is short-circuited. More specifically, as shown in FIG. 4, one end of the feeding pin 52A is connected to an inner conductor 41B of a coaxial waveguide 41. The other end of the feeding pin 52A which forms the distal end is connected to a conductor plate 31 serving as the antenna surface of a radial antenna 30, and is accordingly short-circuited.

A depth d of a cavity 35 as the distance between a circular conductor member 51A of a cavity 35 and the conductor plate 31 of the radial antenna 30 is set to approximately $\lambda/2$. A length $l_1$ of the feeding pin 52A with the distal end connected to the conductor plate 31 is equal to the depth d of the cavity 35, and is accordingly approximately $\lambda/2$. Note that $\lambda$ is the wavelength of the high frequency electromagnetic field. When a high frequency electromagnetic field having a frequency of 2.45 GHz is used, $d = l_1 =$ about 6 cm.

Figures 5A, 5B, 5C:
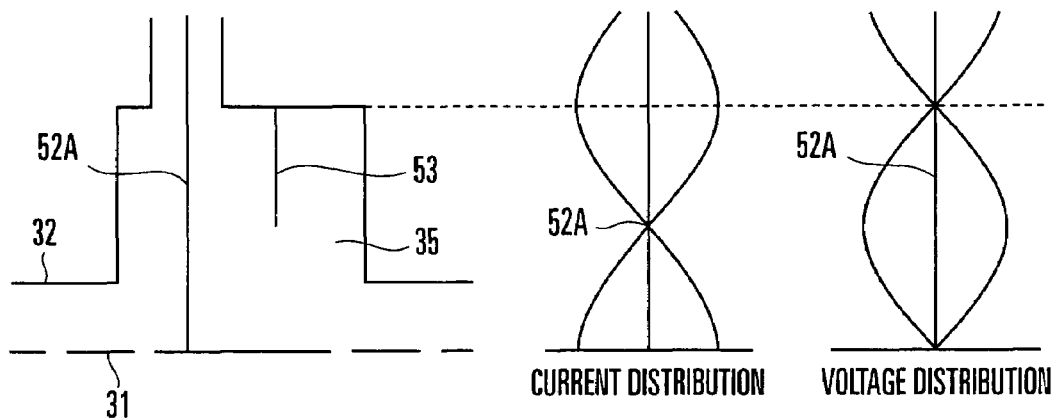
FIG. 5 includes views for explaining the operation and effect of the feeding part in the plasma device according to the second embodiment of the present invention.

The principle of excitation in the cavity 35 which is obtained because of this arrangement will be described with reference to FIG. 5. FIG. 5(a) is a schematic view of a feeding part seen from the side surface, FIG. 5(b) is a conceptual view showing a current distribution above the feeding pin 52A, and FIG. 5(c) is a conceptual view showing a voltage distribution above the feeding pin 52A.

The distal end of the feeding pin 52A is connected to the conductor plate 31 of the radial antenna 30 so that it is short-circuited. As shown in FIG. 5(b), the current amplitude becomes maximum at the distal end of the feeding pin 52A. As the current and voltage are phase-shifted from each other by 90°, the voltage amplitude at the distal end of the feeding pin 52A becomes 0 (zero). As the length $l_1$ of the feeding pin 52A is approximately $\lambda/2$, the voltage distribution above the feeding pin 52A is as shown in FIG. 5(c). The position where the voltage amplitude becomes maximum falls around the center of the depth d of the cavity 35. The electromagnetic field in the cavity 35 is excited by this AC field.

A perturbation pin 53 suffices as far as it has such a length that, of an electrical field E excited by the feeding pin 52, the phase delay of a component E1 in a direction toward the perturbation pin 53 becomes 90°. A length $l_2$ of the perturbation pin 53 suffices as far as it is approximately $\lambda/4$. When a high frequency electromagnetic field having a frequency of 2.45 GHz is used, $l_2 =$ about 3 cm. With this length, the high frequency electromagnetic field excited in the cavity 35 can be converted into a good TM11-mode rotating electromagnetic field.

This arrangement can provide the following effect. When a high frequency electromagnetic field having a frequency of 2.45 GHz is used and the length $l_2$ of the perturbation pin 53 is set to $\lambda/4$, the length $l_2$ of the perturbation pin 53 becomes about 3 cm when the depth d of the cavity 35 is about 6 cm. A gap of about 3 cm can be secured from the distal end of the perturbation pin 53 to the conductor plate 31 serving as the antenna surface. Then, electric discharge that occurs when the gap between the distal end of the perturbation pin 53 and the conductor plate 31 is short can be moderated.

Figure 6A:
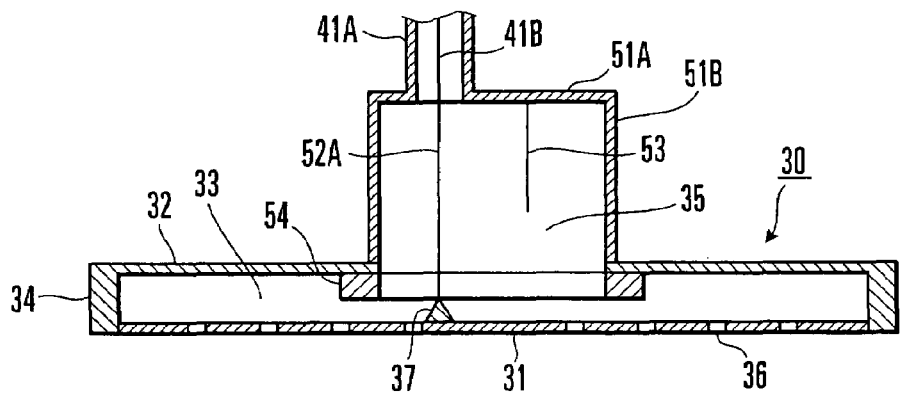
FIG. 6 includes views for explaining modifications of the feeding part in the plasma device according to the second embodiment of the present invention.
Figure 6B:
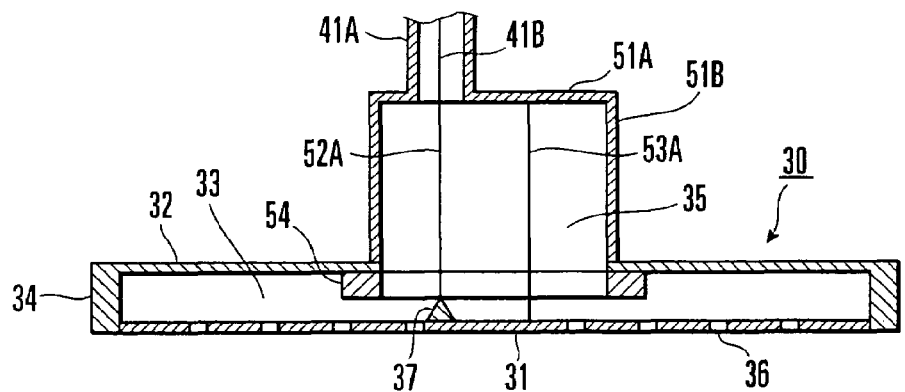

As shown in FIG. 6(a), a conductive member 37 may be formed at the distal end of the feeding pin 52A connected to the conductor plate 31 of the radial antenna 30. The conductive member 37 forms a frustoconical shape having the surface connected to the conductor plate 31 as its bottom surface and spreading toward the conductor plate 31. When the conductive member 37 having this shape is used, the high frequency electromagnetic field resonating in the cavity 35 can be introduced into a radial waveguide 33 easily. Note that the conductive member 37 need not be symmetrical about the extension line of the feeding pin 52A. More specifically, regarding the angle of inclination of the side surface of the conductive member 37 with respect to the extension line of the feeding pin 52A, the smaller the distance between this side surface and an opposing conductor plate 32, the larger the angle of inclination may be. Referring to FIG. 6(a), the angle of inclination of the left side surface of the conductive member 37 may be larger than that of its right side surface.

As shown in FIG. 6(a), the other end of the perturbation pin 53A, one end of which is connected to the circular conductor member 51A, may be connected to the conductor plate 31 of the radial antenna 30, in the same manner as with the feeding pin 52A. This can prevent electric discharge between the perturbation pin 53A and the conductor plate 31.

Figure 7A:
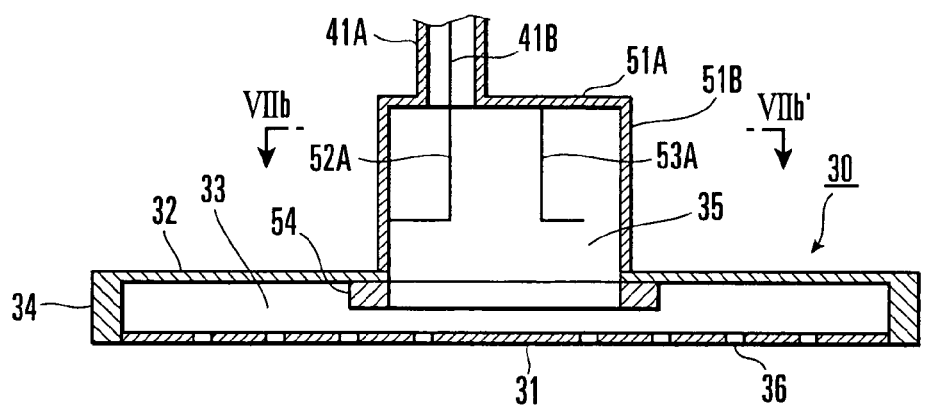
FIG. 7 includes views for explaining a modification of the feeding part in the plasma device according to the second embodiment of the present invention.
Figure 7B:
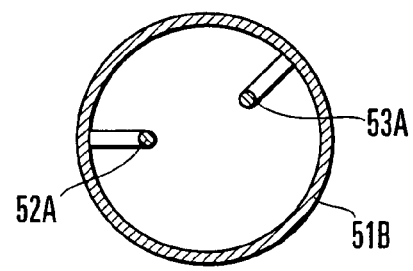

The distal end of the feeding pin 52A may be connected to a cylindrical conductor member 51B. More specifically, as shown in FIG. 7, the feeding pin 52A extends in the axial direction of the cylindrical conductor member 51B from its connecting point with the inner conductor 41B of the coaxial waveguide 41, and is bent at a right angle to be perpendicularly connected to the inner wall surface of the cylindrical conductor member 51B. This can also suppress electric discharge from the feeding pin 52A. In this case, the distal end of the perturbation pin may be open, be connected to the conductor plate 31 of the radial antenna 30, or be connected to the cylindrical conductor member 51B, as shown in FIG. 7. When the lengths of the parallel portions of the feeding pin 52A and perturbation pin are set to approximately $\lambda/4$, a good rotating electromagnetic field can be generated in the cavity 53.

With the distal end of the feeding pin being open or connected to the conductor plate 31 of the radial antenna 30, the perturbation pin 53A may be connected to the cylindrical conductor member 51B.

The third embodiment of the present invention will be described with reference to FIG. 8. Members that are common to the first embodiment are denoted by the same reference numerals, and a description thereof will be omitted.

In the first embodiment described above, the perturbation pin 53 is provided in the cavity 35 that forms the feeding part. In contrast to this, in a plasma device according to the third embodiment, a cavity 35 is formed of a circular conductor member 51A connected to an outer conductor 41A of a coaxial waveguide 41 for feeding a high frequency electromagnetic field, a cylindrical conductor member 51B having one end connected to the circular conductor member 51A and the other end that opens in a radial antenna 30, and conductive members 61A and 61B arranged inside the side wall of the cylindrical conductor member 51B to oppose each other. A feeding pin 52 connected to an inner conductor 41B of the coaxial waveguide 41 is located at a position separate from the center of the circular conductor member 51A in its radial direction.

Figure 8A:
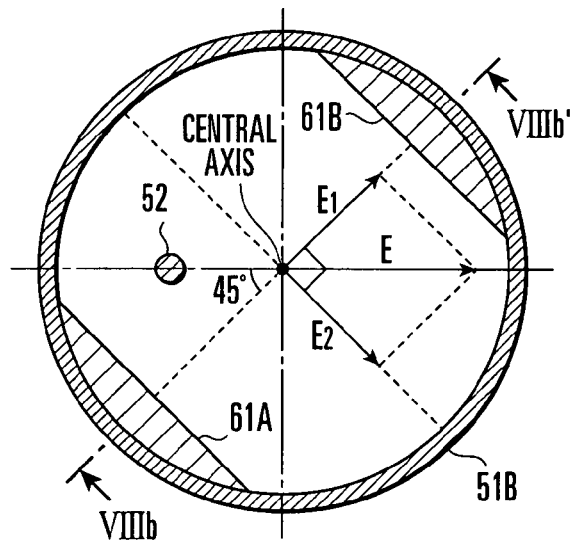
FIG. 8 includes views for explaining a feeding part in a plasma device according to the third embodiment of the present invention.
Figure 8B:
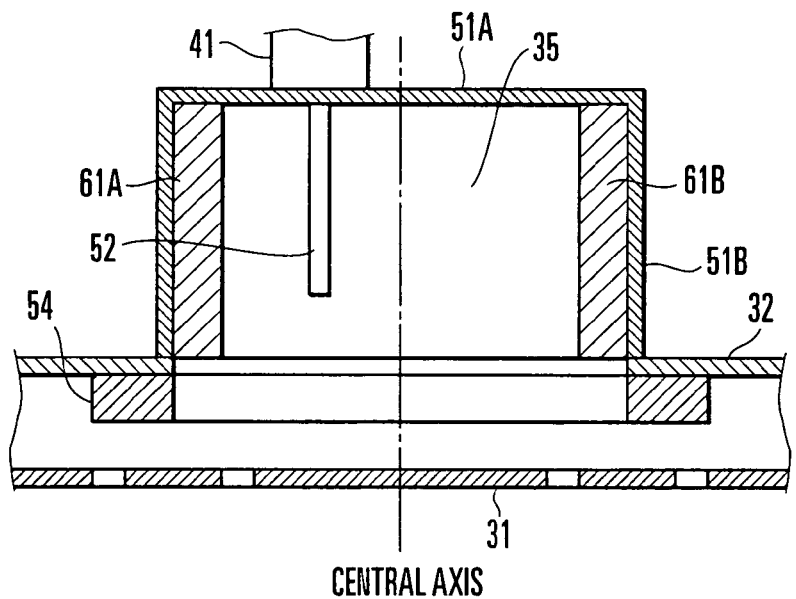

As shown in FIG. 8(b), each of the conductive members 61A and 61B has one end connected to the circular conductor member 51A for forming one end face of the cavity 35, and extends in the axial direction of the cylindrical conductor member 51B. As shown in FIG. 8(a), the sectional shape of each of the conductive members 61A and 61B taken along the direction of the line VIIIb-VIIIb' consists of a circular arc extending along the inside of the side wall of the cylindrical conductor member 51B, and a chord tied to the circular arc.

As shown in FIG. 8(b), each of the conductive members 61A and 61B has one end connected to the circular conductor member 51A for forming one end face of the cavity 35, and extends in the axial direction of the cylindrical conductor member 51B. As shown in FIG. 8(a), the sectional shape of each of the conductive members 61A and 61B taken along the direction of the line VIIIb-VIIIb' consists of a circular arc extending along the inside of the side wall of the cylindrical conductor member 51B, and a chord tied to the circular arc.

Consequently, according to the third embodiment, since the conductive members 61A and 61B are arranged inside the side wall of the cylindrical conductor member 51B to oppose each other, the section of the cavity 35 perpendicular to its central axis has notched portions. In other words, in the section of the cavity 35, a direction that connects the notched portions (to be referred to as "notch direction") is shorter than a direction perpendicular to the notch direction. Accordingly, the capacity of the cavity 35 in the notch direction increases relatively.

In order to form the cavity 35 having such a sectional shape, according to this embodiment, the conductive members 61A and 61B each having the sectional shape as described above are formed in the cylindrical conductor member. 51B, and are electrically connected to each other. Alternatively, this arrangement may be integrally formed by casting.

As shown in FIG. 8, the notched portions of the section of the cavity 35 and the feeding pin 52 are located such that the straight line extending through the feeding pin 52 and the central axis (center of the circular conductor member 51A) and each notch direction forms an angle of about 45°.

When the cavity 35 and feeding pin 52 are formed in this manner, of an electrical field E generated by the feeding pin 52, a notch-direction component E1 is phase-delayed due to the influence of the capacity that has increased relatively.

Hence, when the sizes of the notched portions and the position of the feeding pin 52 are set such that the phase difference between the notch-direction component E1 and a component E2 perpendicular to the notch direction becomes 90°, a TE11-mode rotating electromagnetic field can be obtained.

In the plasma device having the feeding part as described above, a high frequency electromagnetic field generated by a high frequency generator 45 is fed to the cavity 35 through the coaxial waveguide 41. The fed high frequency electromagnetic field is converted into a rotating electromagnetic field by the feeding pin 52 and the cavity 35 whose section perpendicular to the central axis has a pair of opposing notched portions. Simultaneously, the fed high frequency electromagnetic field is partly supplied to a radial waveguide 33 of the radial antenna 30 while resonating in the cavity 35. The high frequency electromagnetic field supplied into the radial antenna 30 propagates in the radial waveguide 33. An electromagnetic field F propagating in the radial waveguide 33 is radiated (or leaked) into a processing vessel 11 through the slots 36 and ionizes a plasma gas introduced into the processing vessel 11 through a nozzle 17, thus generating a plasma S.

At this time, the rotating electromagnetic field which is resonating in the cavity 35 is supplied to the radial waveguide 33. Hence, when the high frequency electromagnetic field is converted into a circularly polarized wave in the cavity 35, the radial antenna 30 radiates (or leaks) a good circularly polarized high frequency electromagnetic field into the processing vessel 11, so that the surface distribution uniformity of the plasma S to be generated can be improved.

Figure 9A:
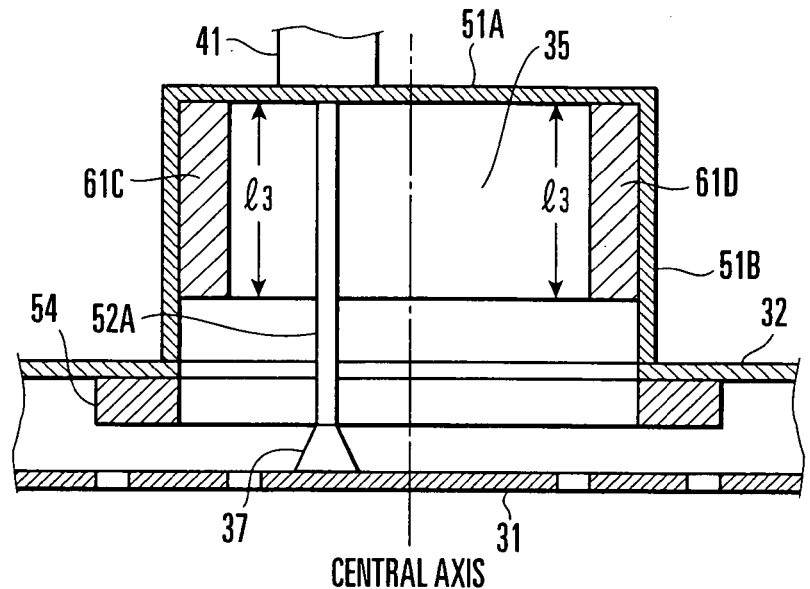
FIG. 9 includes views for explaining modifications of the feeding part in the plasma device according to the third embodiment of the present invention.
Figure 9B:
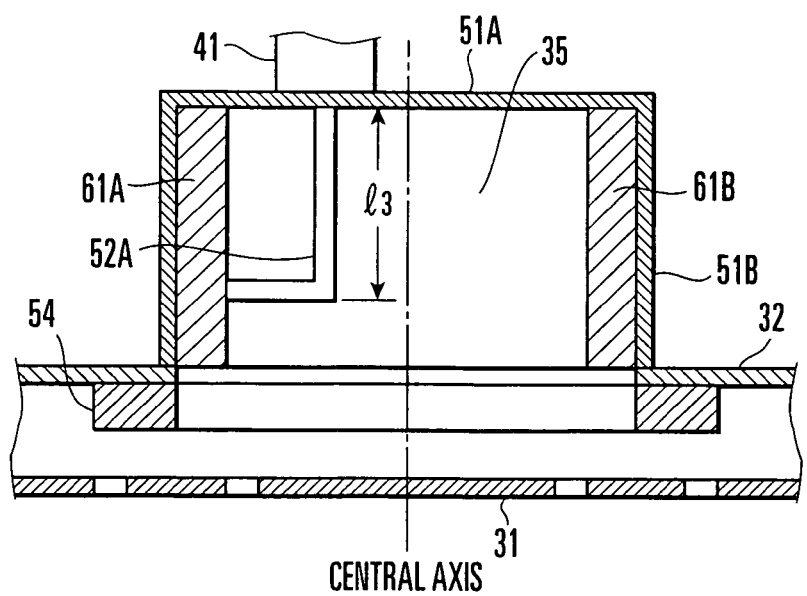

In the third embodiment, in order to set the phase difference between, of the electric field E generated by the feeding pin 52, the notch-direction component E1 and the component E2 perpendicular to it to A10 90° so that a good rotating electromagnetic field can be obtained, lengths $l_3$ of the parallel portions of the conductive members 61A and 61B and feeding pin 52 formed in the conductor plate 31 may be set to approximately $\lambda/4$. Therefore, as shown in FIG. 9(a), when the feeding pin 52A is to be connected to the conductor plate 31 of the radial antenna 30, the lengths of conductor members 61C and 61D (lengths in the axial direction of the cylindrical conductor member 51B) may be set to approximately $l_3 = \lambda/4$. To extend the conductive members 61A and 61B from one end to the other end of the cylindrical conductor member 51B, the length of that portion of a feeding pin 52A which is parallel to the conductive members 61A and 61B may be set to approximately $l_3 32 \lambda/4$. In this case, as shown in FIG. 9(b), the feeding pin 52A may be bent at a right angle at a position of $l_3 = \lambda/4$ from the circular conductor member 51A, and the distal end of the pin 52A may be connected to the conductive member 61A perpendicularly. This can suppress electric discharge that occurs when the distal end of the feeding pin is open.

Figure 10:
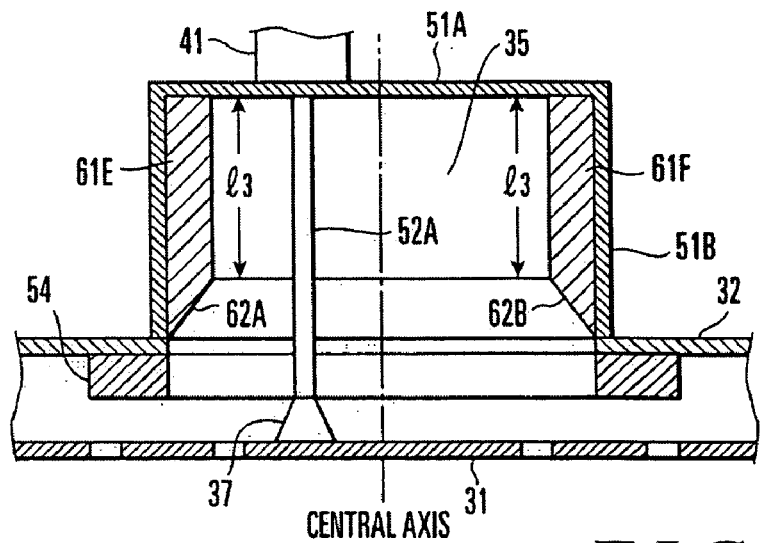
FIG. 10 is a view for explaining a modification of the feeding part in the plasma device according to the third embodiment of the present invention.

As shown in FIG. 10, the ends of conductive members 61E and 61F which are close to the radial antenna 30 may be molded into slopes. In this case, the sectional shape of the cavity 35 seen from a direction perpendicular to the central axis of the cavity 35 has a taper at its portion connected to the radial waveguide 33. With this shape, a change in impedance in the cavity 35 between a region where the conductive member is present and a region where it is not can be moderated, and reflection of the high frequency electromagnetic field at the boundary of the two regions can be suppressed. Even when the ends of the conductive members 61E and 61F are molded into slopes, if the lengths of the main body portions of the conductive members 61E and 61F excluding these ends are set to approximately $l_3=\lambda/4$, a good rotating electromagnetic field can be obtained.

In the third embodiment, the conductive members 61A to 61F are formed on the inner wall surface of the cylindrical conductor member 51B to extend from one end of the cylindrical conductor member 51B in the axial direction, so that the section of the cavity 35 has notched portions, that is, the distance in the notch direction is shortened. Alternatively, as the conductive members, one or a plurality of sets of cylindrical stubs made of conductors may be formed on the inner wall surface of the cylindrical conductor member 51B in the axial direction to oppose each other.

Figure 11:
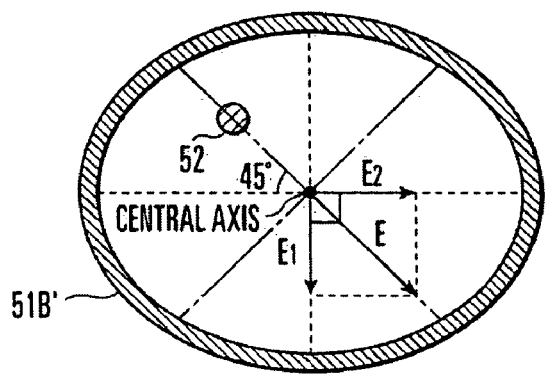
FIG. 11 is a view for explaining a feeding part in a plasma device according to the fourth embodiment of the present invention.

The fourth embodiment will be described with reference to FIG. 11.

In a plasma device according to the fourth embodiment, a section of a cavity 35 for forming a feeding part, which is perpendicular to the central axis of the cavity 35, has an elliptic shape.

More specifically, the cavity 35 is formed of an elliptic conductor member connected to an outer conductor 41A of a coaxial waveguide 41 for feeding a high frequency electromagnetic field, and a cylindrical conductor member 51B' with an elliptic section and having one end connected to the elliptic conductor member and the other end that opens in a radial antenna 30. A ring member 54 having the same inner surface shape as that of the cylindrical conductor member 51B' may also be formed around the opening of the cavity 35 formed at the center of a conductor plate 32 of the radial antenna 30.

In the fourth embodiment, a feeding pin 52 is arranged at a position separate from the center of the elliptic conductor member in the radial direction such that it forms an angle of 45° with each of the major and minor axes of the ellipse.

As a result, of an electric field E generated by the feeding pin 52, a component E1 in the direction of minor diameter of the ellipse is phase-delayed due to the influence of the capacity that has increased relatively. Therefore, when the sectional shape of the cavity 35 and the position of the feeding pin 52 are set such that the phase difference between the component E1 and a component E2 in the direction of major diameter becomes 90°, a TE11-mode rotating electromagnetic field can be obtained.

In the plasma device having such a feeding part, the high frequency electromagnetic field fed to the cavity 35 through the coaxial waveguide 41 is converted into a rotating electromagnetic field by the feeding pin 52 and the cavity 35 having the elliptic section. Simultaneously, the high frequency electromagnetic field is partly supplied to a radial waveguide 33 of the radial antenna 30 while it resonates in the cavity 35.

Therefore, in the same manner as in the first and third embodiments described above, when the high frequency electromagnetic field is converted into a circularly polarized wave in the cavity 35, the radial antenna 30 can radiate (or leak) a good circularly polarized high frequency electromagnetic field into a processing vessel 11, so that the surface distribution uniformity of a plasma S to be generated can be improved.

When the depth of the cavity 35, the thickness of a ring member 54, and the like are adjusted, of the high frequency electromagnetic field resonating in the cavity 35, the proportion of the high frequency electromagnetic field supplied to the radial waveguide 33, that is, a Q-value, can be adjusted.

The fifth embodiment will be described with reference to FIG. 12.

In a plasma device according to the fifth embodiment, two-point feeding is performed to a cavity 35 formed of a circular conductor member 51A and cylindrical conductor member 51B through two coaxial waveguides.

Figure 12:
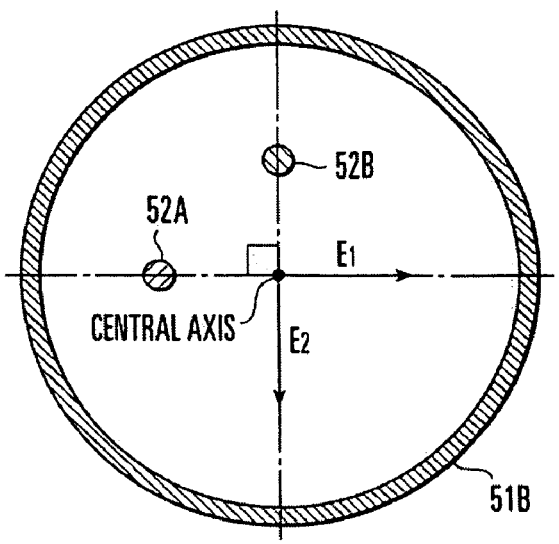
FIG. 12 is a view for explaining a feeding part in a plasma device according to the fifth embodiment of the present invention.

In this embodiment, as shown in FIG. 12, first and second feeding pins 52A and 52B connected to the inner conductors of the first and second coaxial waveguides are formed in the circular conductor member 51A at positions separate from the central axis of the circular conductor member 51A in the radial direction. The positions of the two feeding pins 52A and 52B form a right angle together with the central axis.

When high frequency electromagnetic fields having phases different from each other by 90° are fed from the first and second coaxial waveguides, a TE11-mode rotating electromagnetic field is generated in the cavity 35.

To achieve the phase difference of 90°, a phase converting circuit may be used. Alternatively, high frequency electromagnetic fields having the same phase may be supplied to two coaxial waveguides having lengths different from each other by ¼ the wavelength of the propagating electromagnetic field.

In the plasma device having such a feeding part, when two-point feeding as described above is performed, the high frequency electromagnetic fields fed from the two coaxial waveguides are converted into a rotating electromagnetic field. Simultaneously, the high frequency electromagnetic fields are partly supplied to a radial waveguide 33 of a radial antenna 30 while resonating in the cavity 35.

Therefore, in the same manner as in the first to third embodiments described above, when the high frequency electromagnetic fields are converted into circularly polarized waves in the cavity 35, the radial antenna 30 can radiate (or leak) a good circularly polarized electromagnetic field into a processing vessel 11, so that the surface distribution uniformity of a plasma S to be generated can be improved.

At this time, when the depth of the cavity 35, the thickness of a ring member 54, and the like are adjusted, of the high frequency electromagnetic fields resonating in the cavity 35, the proportion of the high frequency electromagnetic field supplied to the radial waveguide 33, that is, a Q-value, can be adjusted. This is the same as in other embodiments described above.

The sixth embodiment will be described with reference to FIG. 13.

In a plasma device according to the sixth embodiment, a rotating electromagnetic field is generated in a cavity 35 formed of a circular conductor member 51A and cylindrical conductor member 51B, by patch antenna feeding.

Figure 13A:
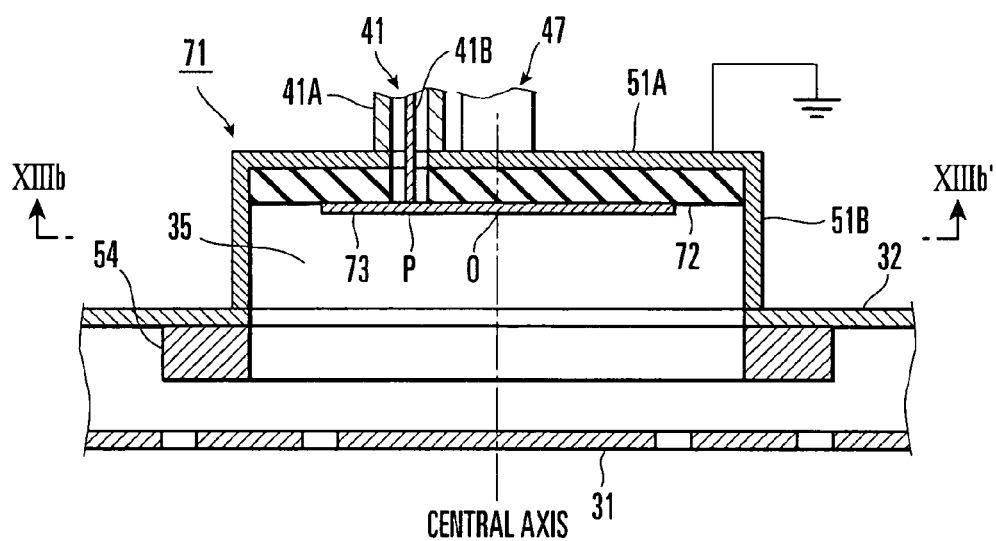
FIG. 13 includes views for explaining a feeding part in a plasma device according to the sixth embodiment of the present invention.

As shown in FIG. 13(a), a patch antenna 71 used in this patch antenna feeding is comprised of the grounded circular conductor member 51A, a dielectric plate 72 arranged on the lower surface of the circular conductor member 51A, and a conductor plate 73 arranged to oppose the circular conductor member 51A through the dielectric plate 72. The circular conductor member 51A is connected to outer conductors 41A and 47A (the outer conductor 47A is not shown) of two coaxial waveguides 41 and 47. The conductor plate 73 is connected to inner conductors 41B and 47B (the inner conductor 47B is not shown) of the two coaxial waveguides 41 and 47. To fix the center of the conductor plate 73 at the ground potential, the center of the conductor plate 73 may be connected to the circular conductor member 51A through a conductor column. The circular conductor member 51A, the conductor plate 73, and the conductor column are formed of copper, aluminum, or the like. The dielectric plate 72 is formed of a ceramic material or the like.

Figure 13B:
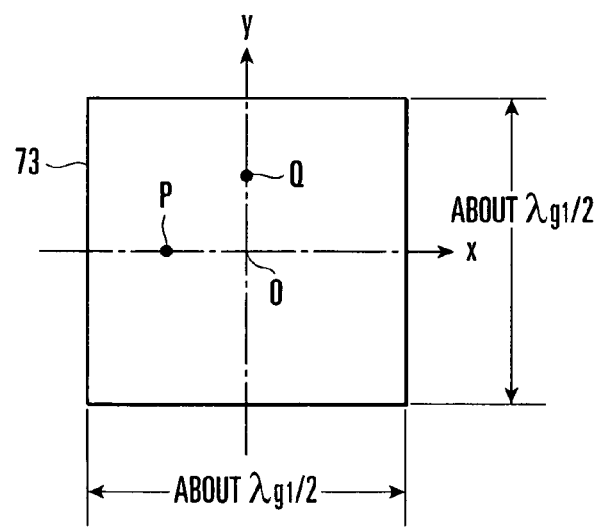

FIG. 13(*b*) is a plan view of the conductor plate 73 seen from the direction of the line XIIIb-XIIIb'. As shown in FIG. 13(*b*), the planar shape of the conductor plate 73 forms a square with sides each having a length of almost A $\lambda g_1/2$. $\lambda g_1$ indicates the wavelength of a high frequency electromagnetic field propagating between the circular conductor member 51A and conductor plate 73.

When an origin O of the coordinate system is set at the center of the conductor plate 73 and x- and y-axes are set parallel to the sides of the conductor plate 73, the inner conductors 41B and 47B of the two coaxial waveguides 41 and 47 are connected to two points on the x- and y-axes that are substantially at the same distance from the origin O on the conductor plate 73. These two points will be called feeding points P and W.

When the two coaxial waveguides 41 and 47 feed high frequency electromagnetic fields having the same amplitude but phases different from each other by 90° to the patch antenna 71 with such an arrangement, a TE11-mode rotating electromagnetic field can be generated in the cavity 35. The principle for this is as follows.

Since the length of the conductor plate 73 in the x-axis direction is $\lambda g_1/2$, the current supplied from one coaxial waveguide 41 to the feeding point P resonates in the x-axis direction, so that the two sides of the conductor plate 73 which are parallel to the y-axis radiate linearly polarized waves parallel to the x-axis. Since the length of the conductor plate 73 in the y-axis direction is also $\lambda g_1/2$, the current supplied from the other coaxial waveguide 47 to the feeding point Q resonates in the y-axis direction, so that the two sides of the conductor plate 73 which are parallel to the x-axis radiate linearly polarized waves parallel to the y-axis. As the feeding phases of the two coaxial waveguides 41 and 47 are different from each other by 90°, the phases of the two radiated linearly polarized waves are also different from each other by 90°. In addition, since the two linearly polarized waves have the same amplitude and intersect spatially, they form a circularly polarized wave, thus generating a rotating electromagnetic field in the cavity 35.

The rotating electromagnetic field generated in this manner is partly supplied to a radial waveguide 33 of a radial antenna 30 while resonating in the cavity 35.

Hence, in the same manner as in other embodiments described above, the radial antenna 30 can radiate (or leak) a good circularly polarized high frequency electromagnetic field into a processing vessel 11, so that the surface distribution uniformity of a plasma S to be generated can be improved.

At this time, when the depth of the cavity 35, the thickness of a ring member 54, and the like are adjusted, of the high frequency electromagnetic fields resonating in the cavity 35, the proportion of the high frequency electromagnetic field supplied to the radial waveguide 33, that is, a Q-value, can be adjusted. This is the same as in other embodiments described above.

To achieve a feeding phase difference of 90° for the patch antenna 71, a phase converting circuit may be used. Alternatively, high frequency electromagnetic fields having the same phase may be supplied to two coaxial waveguides having lengths different from each other by ¼ the wavelength of the propagating electromagnetic field.

The planar shape of the conductor plate 73 of the patch antenna 71 may be, other than the square shown in FIG. 13(*b*), a 90°-rotational symmetric shape (a shape that overlies on the conductor plate 73 when it is rotated through 90° about its center) such as a circle. When the planar shape of the conductor plate 73 is a circle, its diameter is preferably set to almost $1.17 \times \lambda g_1/2$. Moreover, the planar shape of the conductor plate 73 can be a rectangle or the like whose lengths in two orthogonal directions seen from the center are different. In this case, the difference in feeding phase between the two feeding points P and Q is not set to 90°, but is adjusted in accordance with the lengths of the conductor plate 73 in the two directions described above.

The seventh embodiment will be described with reference to FIG. 14. Members that are common to the sixth embodiment are denoted by the same reference numerals, and a description thereof will be omitted.

In the sixth embodiment, the two-point-feeding patch antenna 71 using the two coaxial waveguides 41 and 47 is used. In contrast to this, in the seventh embodiment, a one-point-feeding patch antenna 75 using a single coaxial waveguide 41 is used.

Figure 14A:
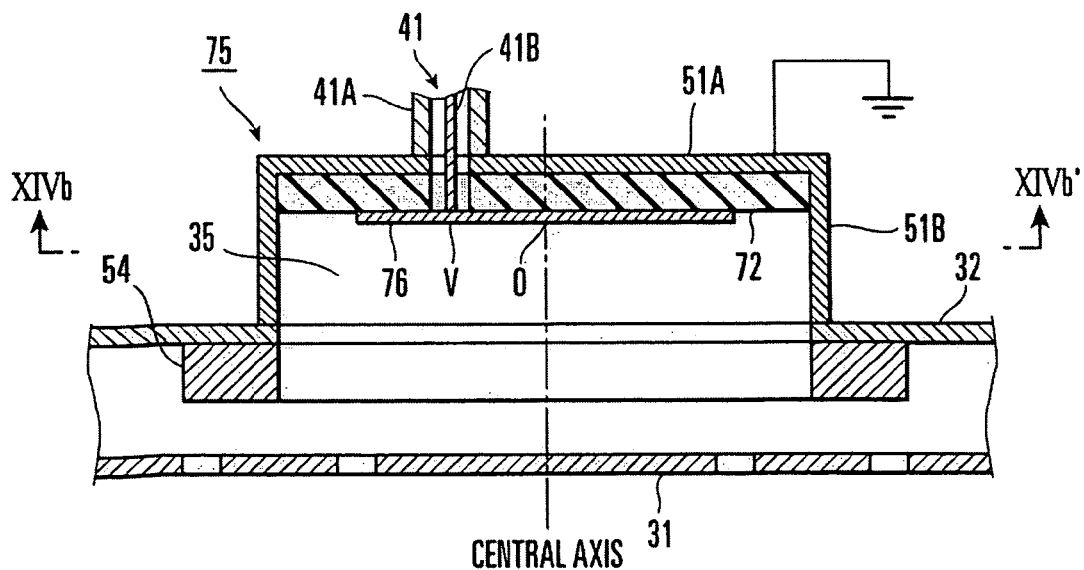
FIG. 14 includes views for explaining a feeding part in a plasma device according to the seventh embodiment of the present invention.
Figure 14B:
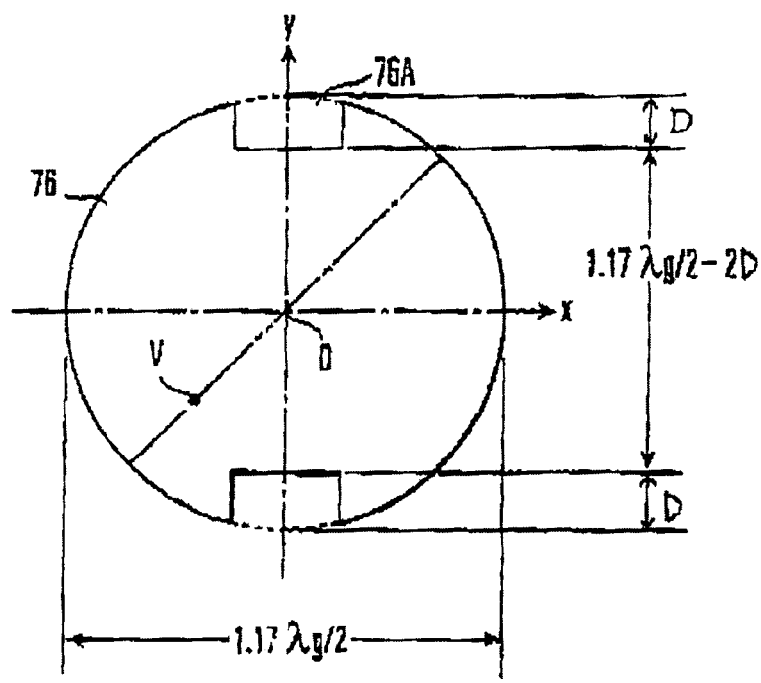

As shown in FIG. 14(*a*), the patch antenna 75 is formed of a grounded circular conductor member 51A, a dielectric plate 72 arranged on the lower surface of the circular conductor member 51A, and a conductor plate 76 arranged to oppose the circular conductor member 51A through the dielectric plate 72. The circular conductor member 51A is connected to an outer conductor 41A of the coaxial waveguide 41. A conductor plate 76 is connected to an inner conductor 41B of the coaxial waveguide 41.

FIG. 14(*b*) is a plan view of the conductor plate 76 seen from the direction of the line XIVb-XIVb'. As shown in FIG. 14(*b*), the conductor plate 76 has a planar shape obtained by partly notching the peripheral region of a circle 76A. More specifically, two regions near the intersection between the circumference and the y-axis are notched rectangularly. The notched area may be set to almost 3% the area of the circle 76A. In this embodiment, the length of the conductor plate 76 in the x-axis direction is set to $1.17 \times \lambda g_1/2$, and its length in the y-axis direction is set to $1.17 \times \lambda g_1/2 - 2D$.

The inner conductor 41B of the coaxial waveguide 41 is connected to one point on a straight line that intersects each of the x- and y-axes at an angle of 45°. This point is called a feeding point V.

The current supplied from the coaxial waveguide 41 to the feeding point V of the conductor plate 76 flows in the x- and y-axis directions independently. As the length in the y-axis direction is shorter than $1.17 \times \lambda g_1/2$ by 2 d, the dielectric constant on the side of the electromagnetic field increases, and the phase of the current flowing in the y-axis direction delays. When the value of 2 d and the lengths of the notched portions are set such that the phase delay becomes 90°, the patch antenna 75 radiates a circularly polarized wave, so that a TE11-mode rotating electromagnetic field is generated in a cavity 35.

The rotating electromagnetic field generated in this manner is partly supplied to a radial waveguide 33 of a radial antenna 30 while resonating in the cavity 35.

Hence, in the same manner as in the sixth embodiment described above, the radial antenna 30 can radiate (or leak) a good circularly polarized high frequency electromagnetic field into a processing vessel 11, so that the surface distribution uniformity of a plasma S to be generated can be improved.

The planar shape of the conductor plate 76 is not limited to that shown in FIG. 14(*b*), but suffices as far as at least its lengths in two orthogonal directions seen from the center of the conductor plate 76 differ. Accordingly, the conductor plate 76 can be an ellipse, or a rectangle having a long side with a length of almost $\lambda g_1/2$ and a short side with a length of almost less than $\lambda g_1/2$.

The eighth embodiment of the present invention will be described with reference to FIG. 15.

In a plasma device according to the eighth embodiment, a rotating electromagnetic field is generated in a cavity 35 formed of a circular conductor member 51A and cylindrical conductor member 51B, by slot feeding using a TE10-mode rectangular waveguide 81.

The E-surface of the rectangular waveguide 81 (a side surface perpendicular to the electric field in the waveguide) used for this slot feeding has a cross slot 82. The cross slot 82 is formed of two slots with different lengths that intersect at their centers. The centers of the two slots, i.e., the center of the cross slot 82 is substantially on the central axis of the E-surface.

Regarding the two slots for forming the cross slot 82, the lengths of the respective slots are adjusted such that the frequency characteristics against 2.45 GHz are relatively different from each other by approximately 55° to 70°, and the angles of the respective slots are adjusted such that the amplitudes of the electric fields radiated through the corresponding slots become equal.

A terminal end 83 of the rectangular waveguide 81 is closed with a metal. Hence, the cross slot 82 is arranged at such a position that its center is separate from the terminal end 83 of the rectangular waveguide 81 by substantially $\lambda g_2/2$, so that the amplitude of the electromagnetic field radiated through the cross slot 82 becomes maximum. Note that $\lambda g_2$ is the wavelength of a high frequency electromagnetic field propagating in the rectangular waveguide 81.

FIG. 16 shows design examples of the cross slot 82. FIG. 16 includes plan views each showing the E-surface of the rectangular waveguide 81 seen from the direction of the line XVI-XVI'.

Figure 16A:
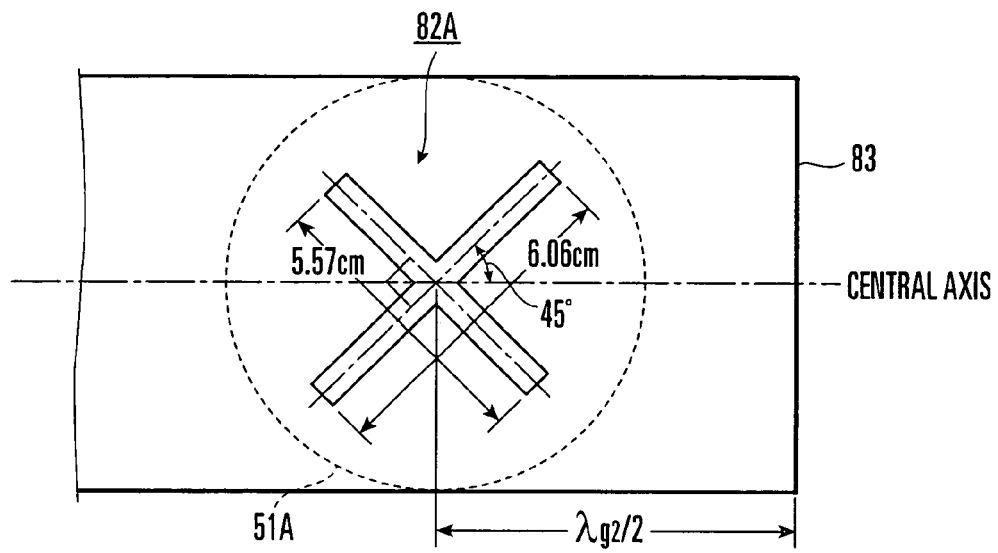
FIG. 16 includes views for explaining design examples of a cross slot used in the plasma device according to the eighth embodiment of the present invention.

In a cross slot 82A shown in FIG. 16(a), the two slots that form the cross slot 82A intersect at substantially a right angle, and are inclined at substantially 45° with respect to the central axis of the E-surface of the rectangular waveguide 81. The slots have lengths of 5.57 cm and 6.06 cm, respectively.

Figure 16B:
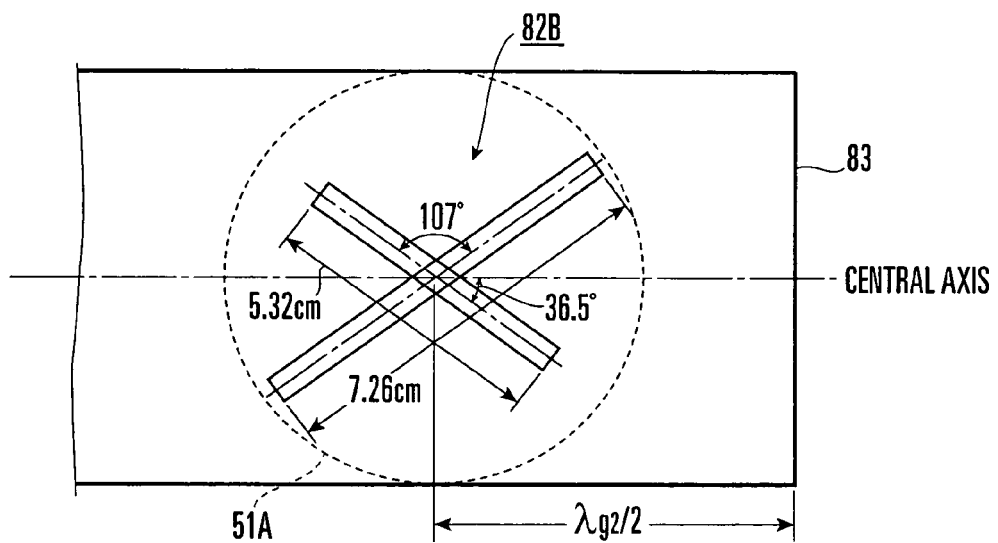

In a cross slot 82B shown in FIG. 16(b), the two slots that form the cross slot 82B intersect at substantially 107°, and are inclined at substantially 36.5° with respect to the central axis of the E-surface of the rectangular waveguide 81. The slots have lengths of 5.32 cm and 7.26 cm, respectively.

When the cross slot 82A or 82B is formed in the E-surface of the rectangular waveguide 81, a TE11-mode circularly polarized wave having a very small axial ratio against a frequency of 2.45 GHz can be obtained.

Figure 15:
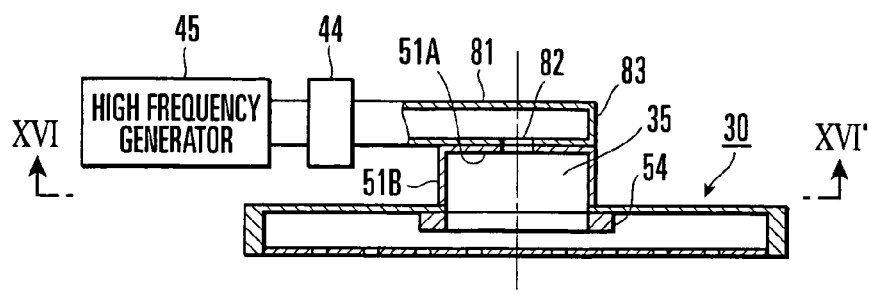
FIG. 15 is a view for explaining a feeding part in a plasma device according to the eighth embodiment of the present invention.

In the eighth embodiment, as shown in FIG. 15, the E-surface of the rectangular waveguide 81 where the cross slot 82 is formed is bonded to the circular conductor member 51A which forms one end face of the cavity 35, and the cross slot 82 is arranged such that its center coincides with the central axis of the cavity 35. At least that region of the circular conductor member 51A which opposes the cross slot 82 is open, so that the high frequency electromagnetic field propagating in the rectangular waveguide 81 is radiated into the cavity 35.

The center of the cross slot 82 and the central axis of the cavity 35 need not coincide with each other. One end of the cylindrical conductor member 51B may be closed with the E-surface of the rectangular waveguide 81, and part of the E-surface of the rectangular waveguide 81 may form the circular conductor member 51A.

In this plasma device, the high frequency electromagnetic field generated by a high frequency generator 45 propagates in the rectangular waveguide 81 and is radiated into the cavity 35 through the cross slot 82 formed in the E-surface. The high frequency electromagnetic field radiated into the cavity 35 forms a TE11-mode circularly polarized wave, thus generating a rotating electromagnetic field. The rotating electromagnetic field is partly supplied to a radial waveguide 33 of a radial antenna 30 while resonating in the cavity 35.

Therefore, in the same manner as in other embodiments described above, the radial antenna 30 can radiate (or leak) a good circularly polarized high frequency electromagnetic field into a processing vessel 11, so that the surface distribution uniformity of a plasma S to be generated can be improved.

Figure 17A:
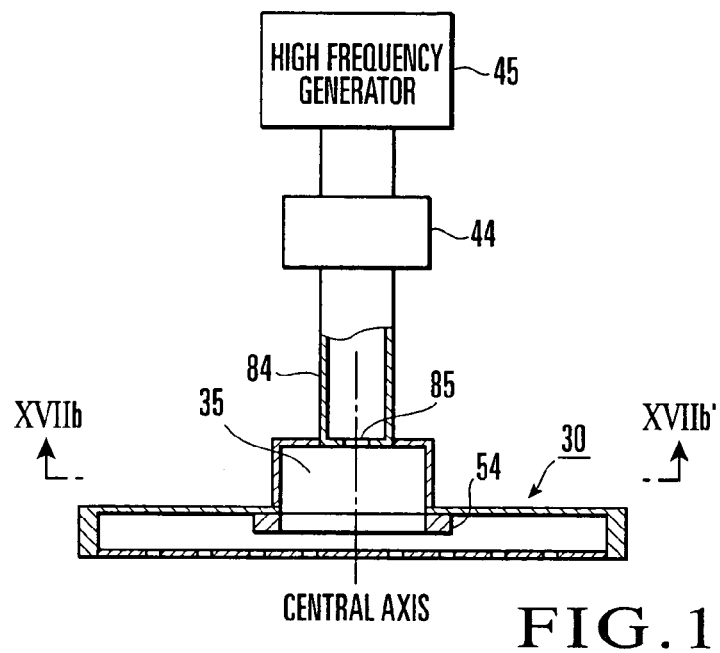
FIG. 17 includes views for explaining modifications of the feeding part in the plasma device according to the eighth embodiment of the present invention.

As shown in FIG. 17(a), slot feeding may be performed by forming a cross slot 85 in the terminal end face of a TE10-mode rectangular waveguide 84. The cross slot 85 formed in the terminal end face of the rectangular waveguide 84 has almost the same arrangement as that of the cross slot 82 formed in the E-surface. More specifically, the cross slot 85 is formed of two slots intersecting at their centers. The two slots are adjusted such that their frequency characteristics against 2.45 GHz are relatively different from each other by about 550 to 700, and such that they have different lengths. Note that the center of the cross slot 85 is arranged at substantially the center of the terminal end face of the rectangular waveguide 84.

Figure 17B:
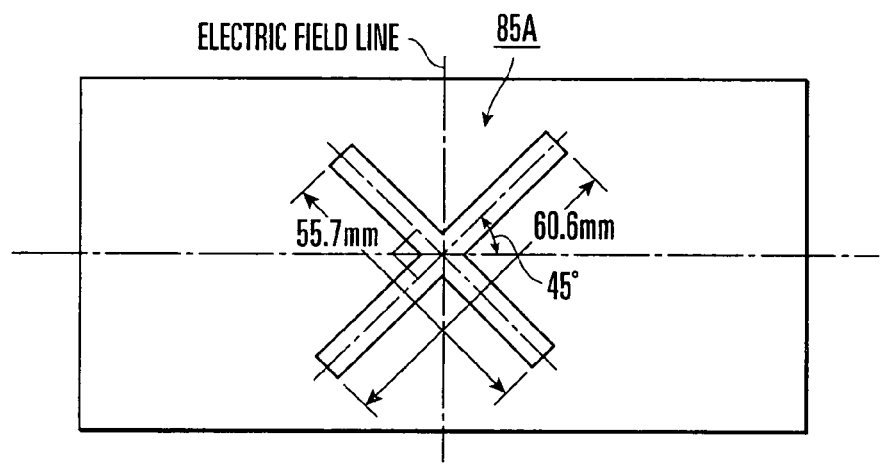

FIG. 17(b) shows a design example of the cross slot 85. FIG. 17(b) is a plan view of the terminal end face of the rectangular waveguide 84 seen from the direction of the line XVIIb-XVIIb'. In a cross slot 85A shown in FIG. 17(b), the two slots that form the cross slot 85A intersect at a substantially right angle, and are inclined at substantially 45° with respect to an imaginary electric field line formed at the center of the rectangular waveguide 84. The slots have lengths of 5.57 cm and 6.06 cm, respectively. When this cross slot 85A is formed at the terminal end face of the rectangular waveguide 84, a TE11-mode circularly polarized wave having a very small axial ratio against a frequency of 2.45 GHz can be obtained.

Therefore, when a high frequency electromagnetic field is fed through the cross slot 85 formed in the terminal end face of the rectangular waveguide 84, a rotating electromagnetic field can be generated in the cavity 35. Hence, the surface distribution uniformity of a plasma S to be generated in a processing vessel 11 can be improved in the same manner as in a case wherein the electromagnetic field is fed through the cross slot 82 formed in the E-surface of the rectangular waveguide 81.

Figure 18:
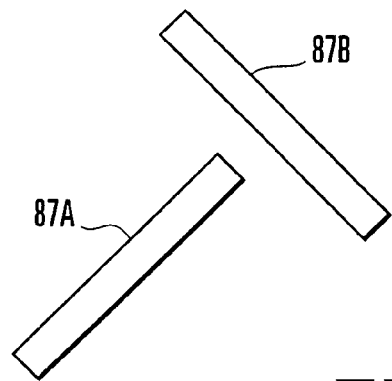
FIG. 18 is a view for explaining another example of slots used in the plasma device according to the eighth embodiment of the present invention.
Figure 21:
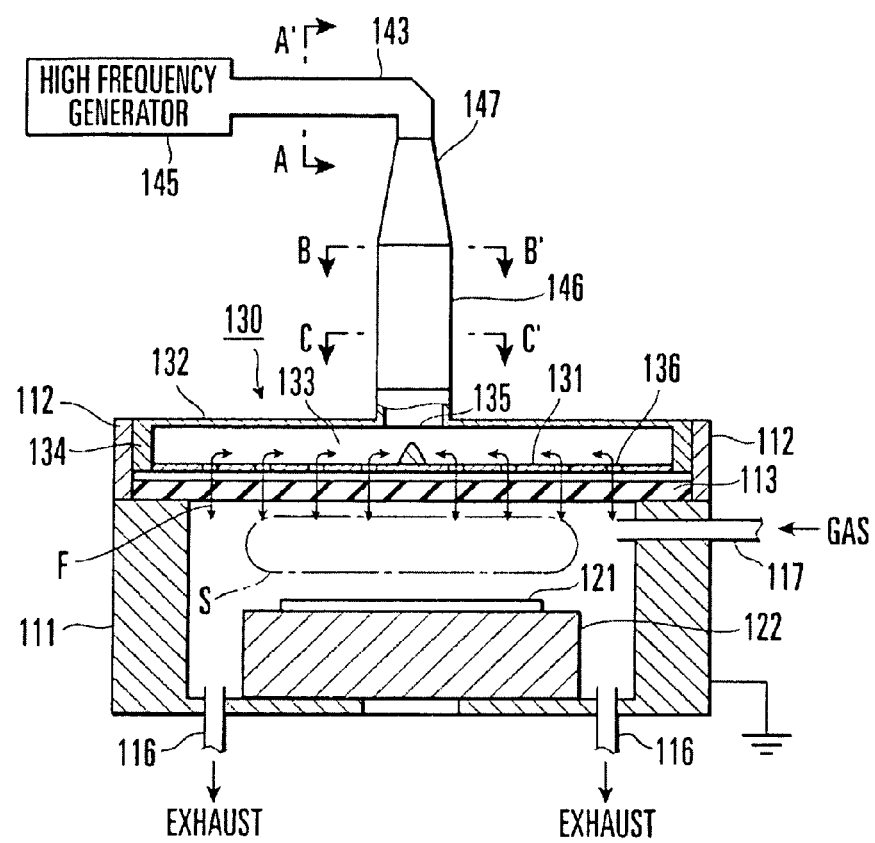
FIG. 21 is a view for explaining a conventional plasma device.

The eighth embodiment shows examples of slot feeding through the cross slots 82 and 85. Alternatively, as shown in FIG. 18, slot feeding may be performed by using a so-called inverted-V-shaped slot formed by arranging two slots 87A and 87B, extending in directions perpendicular to each other, at separate positions.

The planar shape of each of the slots that form the cross slot 82 or 85 or an inverted-V-shaped slot may form a rectangle as shown in FIG. 19(a), or a shape obtained by tying two ends of two parallel straight lines with curves such as arcs, as shown in FIG. 19(b). A slot length L is the length of the long side of the rectangle in FIG. 19(a), and is the length of positions that maximize the gap between the two opposing curves in FIG. 19(b).

As shown in FIGS. 15 and 17, in each of the rectangular waveguides 81 and 84, a matching circuit 44 may be arranged between the high frequency generator 45 and the portion where the cross slot 82 or 85 is formed. With this arrangement, the reflected power from the plasma load can be returned to the load side again without returning it to the high frequency generator 45, so that power can be supplied to the plasma efficiently.

In the radial antenna 30 used in each of the above embodiments of the present invention, the conductor plate 31 that forms the slot surface is a flat plate. Alternatively, as in a radial antenna 30A shown in FIG. 20, a conductor plate 31A for forming the slot surface may be a circular cone. The electromagnetic field radiated (or leaked) from the slot surface that forms the circular cone becomes incident on a plasma plane defined by a flat plate-like dielectric plate 13 in an oblique direction. This increases the electromagnetic field absorption efficiency of the plasma. Thus, the standing wave present between the antenna surface and the plasma plane becomes weak, so that the plasma distribution uniformity can be improved.

The conductor plate 31A for forming the antenna surface of the radial antenna 30A can have a convex shape other than a circular cone. This convex shape can convex either upward or downward. The circular conductor member 51A for forming one end face of the cavity 35 may have a convex shape similar to the shape of the conductor plate 31A of the radial antenna 30A.

As has been described above, according to the embodiments described above, a cavity for forming a resonator is formed in a feeding part. A high frequency electromagnetic field supplied to the cavity is converted into a rotating electromagnetic field. Simultaneously, the rotating electromagnetic field is partly supplied into a waveguide while resonating in the cavity. When the rotating electromagnetic field is circularly polarized in the cavity, a rotating electromagnetic field which is circularly polarized can be supplied to the waveguide. Thus, the surface distribution uniformity of a plasma to be generated can be improved.

INDUSTRIAL APPLICABILITY

The present invention can be applied to a process, e.g., etching, CVD, or ashing, that uses a plasma.

The invention claimed is:

1. A plasma device characterized by comprising:
    a cavity for forming a resonator and outputting by converting the fed high frequency electromagnetic field into a rotating electromagnetic field;
    a waveguide consisting of a first conductive plate in which said cavity opens and a second conductive plate in which a plurality of slots are formed opposing said first conductive plate;
    a ring member which is formed externally around an opening of said cavity in said first conductive plate and is disposed within the waveguide, has an inner diameter which is the same as that of said cavity, and protrudes from said first conductive plate toward said second conductive plate; and
    a processing vessel, in which a plasma is generated by the high frequency electromagnetic field supplied from said cavity through said waveguide;
    wherein the cavity is formed of a circular conductor member connected to an outer conductor of a coaxial waveguide for feeding the high frequency electromagnetic field and a cylindrical conductor member having one end connected to the circular conductor member and the other end that opens in the waveguide,
    wherein a feeding pin is provided at a position separate from a center of the circular conductor member in a radial direction thereof and having one end connected to an inner conductor of the coaxial waveguide, and
    wherein a perturbation pin is provided at a position that forms a predetermined angle with the feeding pin through the center of the circular conductor member and having one end connected to the circular conductor member.

2. A plasma device according to claim 1, characterized in that the other end of the feeding pin is open.

3. A plasma device according to claim 1, characterized in that the other end of the feeding pin is connected to an antenna surface having slots which forms a slot antenna.

4. A plasma device according to claim 3, characterized in that the other end of the feeding pin is provided with a conductive member which forms a frustoconical shape spreading toward the antenna surface.

5. A plasma device according to claim 3, characterized in that the other end of the perturbation pin is connected to the antenna surface.

6. A plasma device according to claim 3, characterized in that the other end of the perturbation pin is connected to the cylindrical conductor member.

7. A plasma device according to claim 1, characterized in that the other end of the feeding pin is connected to the cylindrical conductor member.

8. A plasma device according to claim 7, characterized in that the other end of the perturbation pin is connected to an antenna surface having slots which forms the slot antenna, or the cylindrical conductor member.

9. A plasma device according to claim 1, wherein a conductive member is opposedly arranged inside a side wall of the cylindrical conductor member.

10. A plasma device according to claim 9, characterized in that a length of the conductive member in an axial direction of the cylindrical conductor member is substantially ¼ a wavelength of the high frequency electromagnetic field.

11. A plasma device according to claim 9, characterized in that an end of the conductive member which is close to the waveguide is molded to form a slope.

12. A plasma device according to claim 11, characterized in that a length of a main body of the conductive member excluding one end thereof in an axial direction of the cylindrical conductor member is substantially ¼ a wavelength of the high frequency electromagnetic field.

13. A plasma device according to claim 9, characterized in that the other end of the feeding pin is connected to an antenna surface having a slot for forming a slot antenna.

14. A plasma device according to claim 9, characterized in that the other end of the feeding pin is connected to the conductor member at a position separate from the circular conductor member in an axial direction of the cylindrical conductor member by substantially ¼ a wavelength of the high frequency electromagnetic field.

15. A plasma device according to claim 1, characterized in that the cavity is formed of an elliptic conductor member connected to an outer conductor of a coaxial waveguide for feeding the high frequency electromagnetic field and a cylindrical conductor member with an elliptic section having one end connected to the elliptic conductor member and the other end that opens in the waveguide, and
    a feeding pin is provided at a position separate from a center of the elliptic conductor member in a radial direction thereof to form a predetermined angle with each of major and minor diameters of the elliptic conductor member and connected to an inner conductor of the coaxial waveguide.

16. A plasma device according to claim 1, characterized in that the cavity is formed of a circular conductor member connected to outer conductors of first and second coaxial waveguides for feeding the high frequency electromagnetic field and a cylindrical conductor member having one end connected to the circular conductor member and the other end that opens in the waveguide, and the cavity includes two feeding pins a first feeding pin is provided at a position separate from a center of the circular conductor member in a radial direction thereof and connected to an inner conductor of the first coaxial waveguide, and a second feeding pin is provided at a position to form a predetermined angle with the first feeding pin through the center of the circular conductor member and connected to an inner conductor of the second axial waveguide.

17. A plasma device according to claim 1, characterized in that the cavity is formed of a circular conductor member connected to an outer conductor of at least one coaxial waveguide for feeding a high frequency electromagnetic field, and a cylindrical conductor member having one end connected to said circular conductor member and the other end that opens in said waveguide, and the plasma device comprises a patch antenna for radiating the high frequency electromagnetic field fed from said at least one coaxial waveguide into the cavity as the rotating electromagnetic field, said patch antenna including said circular conductor member and a conductor plate opposedly arranged at a predetermined gap from said circular conductor member and connected to an inner conductor of said at least one coaxial waveguide.

18. A plasma device according to claim 1, characterized in that the cavity is formed of one side surface or terminal end face of a rectangular waveguide for feeding a high frequency electromagnetic field, and a cylindrical conductor member having one end connected to one side surface or terminal end face of said rectangular waveguide and the other end that opens in said waveguide, and a plurality of slots for radiating the high frequency electromagnetic field into the cavity as the rotating electromagnetic field are formed in one side surface or terminal end face of said rectangular waveguide.

19. A plasma device according to claim 18, characterized in that the plurality of slots comprise two slots intersecting at mid points thereof.

20. A plasma device according to claim 18, characterized in that the plurality of slots comprise two slots arranged separate from each other and extending in directions substantially perpendicular to each other.

* * * * *